(12) United States Patent
Sanekata et al.

(10) Patent No.: US 11,009,541 B2
(45) Date of Patent: *May 18, 2021

(54) ELECTRONIC COMPONENT HANDLER AND ELECTRONIC COMPONENT TESTER

(71) Applicant: Seiko Epson Corporation, Tokyo (JP)

(72) Inventors: Takahito Sanekata, Shiojiri (JP); Hirokazu Ishida, Matsumoto (JP); Daisuke Ishida, Chino (JP)

(73) Assignee: Seiko Epson Corporation

( * ) Notice: Subject to any disclaimer, the term of this patent is extended or adjusted under 35 U.S.C. 154(b) by 98 days.

This patent is subject to a terminal disclaimer.

(21) Appl. No.: 16/021,653

(22) Filed: Jun. 28, 2018

(65) Prior Publication Data

US 2019/0004104 A1 Jan. 3, 2019

(30) Foreign Application Priority Data

Jun. 29, 2017 (JP) .............................. JP2017-127045

(51) Int. Cl.
*G01R 31/26* (2020.01)
*G01R 31/28* (2006.01)

(52) U.S. Cl.
CPC ......... *G01R 31/26* (2013.01); *G01R 31/2867* (2013.01); *G01R 31/2893* (2013.01); *G01R 31/2891* (2013.01)

(58) Field of Classification Search
None
See application file for complete search history.

(56) References Cited

U.S. PATENT DOCUMENTS

| 5,394,100 | A | 2/1995 | Bohler et al. |
| 6,245,660 | B1 | 6/2001 | Sumitani |
| 7,921,997 | B2 * | 4/2011 | Burns ................ A45C 13/00 206/320 |

(Continued)

FOREIGN PATENT DOCUMENTS

| CN | 101180549 A | 5/2008 |
| CN | 101937055 A | 1/2011 |

(Continued)

OTHER PUBLICATIONS

Miyamoto Haruhiko; Handler and Inspection Device; Date of publication: Oct. 16, 2014; Seiko Epson Corp; CPC: G01R31/26 (Year: 2014).*

*Primary Examiner* — Nasima Monsur
(74) *Attorney, Agent, or Firm* — Harness, Dickey & Pierce, P.L.C.

(57) ABSTRACT

An electronic component handler includes: a transport unit which transports an electronic component; a region where an electronic component placement unit on which the electronic component is placed is capable of being disposed; a light irradiation unit which is capable of emitting light and capable of adjusting an irradiation direction of the light with respect to the electronic component placement unit; a processing unit which performs determination processing about the presence or absence of the electronic component in the electronic component placement unit based on at least one of a projection shape and an irradiation position of the light projected to the electronic component placement unit; and a display unit which displays an image having the projection shape.

13 Claims, 20 Drawing Sheets

(56) References Cited

U.S. PATENT DOCUMENTS

| | | | |
|---|---|---|---|
| 2004/0022677 A1* | 2/2004 | Wohlstadter | G01N 21/66 422/52 |
| 2009/0136118 A1* | 5/2009 | Ichikawa | G01N 21/95607 382/145 |
| 2010/0030347 A1* | 2/2010 | Shindo | H01L 21/67259 700/59 |
| 2010/0329586 A1 | 12/2010 | Stellari et al. | |
| 2011/0292233 A1 | 12/2011 | Chu et al. | |
| 2014/0184784 A1 | 7/2014 | Yanase | |
| 2016/0178512 A1 | 6/2016 | Hall et al. | |
| 2017/0045577 A1* | 2/2017 | Ding | G01B 11/272 |

FOREIGN PATENT DOCUMENTS

| | | |
|---|---|---|
| CN | 102263926 A | 11/2011 |
| CN | 103620482 A | 3/2014 |
| CN | 106829359 A | 6/2017 |
| CN | 109997049 A | 7/2019 |
| JP | 2014-196908 A | 10/2014 |
| TW | 469482 B | 12/2001 |
| TW | M414656 U1 | 10/2011 |
| TW | 201708834 A | 3/2017 |

\* cited by examiner

ELECTRONIC COMPONENT HANDLER AND ELECTRONIC COMPONENT TESTER

BACKGROUND

1. Technical Field

The present invention relates to an electronic component handler and an electronic component tester.

2. Related Art

From the related art, there has been known a tester that electrically tests electronic components, such as an IC device (for example, refer to JP-A-2014-196908). In the tester described in JP-A-2014-196908, when performing a test on the IC device, the IC device is transported to a test socket, placed on a test socket, and tested. Further, in the tester described in JP-A-2014-196908, it is determined whether or not the IC device remains in the test socket, that is, the presence or absence of the IC device, prior to performing the test on the IC device. The determination is necessary, because, for example, in a case where the IC device remains in the test socket, the IC device to be tested will overlap the remaining device and there is a concern that an accurate test result cannot be obtained. In addition, in the tester described in JP-A-2014-196908, in a state where the test socket is irradiated with slit light, two images having different capturing timing (before and after transporting the IC device) are obtained, the difference (image difference) of the two images is detected, and the determination on the presence or absence of the IC device is performed based on the detection result.

However, in the tester described in JP-A-2014-196908, it is necessary to adjust the position or the direction of the laser light source (light irradiation unit) which emits the slit light in accordance with the type of the test socket. For example, in a case where the adjustment is manually performed, that is, in a case where the laser light source is manually touched directly, depending on the type of the test socket (for example, the size of the recess portion for accommodating the IC device of the test socket therein is extremely small), there is a case where it is difficult to accurately irradiate a position at which accurate determination of the presence or absence of the IC device is performed with the slit light from the laser light source.

SUMMARY

An advantage of some aspects of the invention is to solve at least a part of the problems described above, and the invention can be implemented as the following configurations.

An electronic component handler according to an aspect of the invention includes: a transport unit which transports an electronic component; a region where an electronic component placement unit on which the electronic component is placed is capable of being disposed; a light irradiation unit which is capable of emitting light and capable of adjusting an irradiation direction of the light with respect to the electronic component placement unit; a processing unit which performs determination processing about the presence or absence of the electronic component in the electronic component placement unit based on at least one of a projection shape and an irradiation position of the light projected to the electronic component placement unit; and a display unit which displays an image having the projection shape.

With this configuration, when adjusting the irradiation direction of the light, it is possible to adjust the position or the posture of the light irradiation unit while confirming a screen including an image having the projection shape on the electronic component placement unit of the light. Accordingly, it is possible to grasp the irradiation position regardless of the size and type of the electronic component placement unit, and to adjust the irradiation position to be positioned at a target position of the electronic component placement unit. As a result, it is possible to accurately adjust the irradiation direction of the light emitted from the light irradiation unit with respect to the electronic component placement unit.

In the electronic component handler according to the aspect of the invention, it is preferable that the display unit is capable of displaying a projection position of the light and an image obtained by capturing the electronic component placement unit.

With this configuration, when adjusting the irradiation direction of the light, it is possible to adjust the position or the posture of the light irradiation unit while confirming the screen including the image which is in a state where the irradiation position is at a predetermined position. Accordingly, it is possible to grasp the irradiation position regardless of the size and type of the electronic component placement unit, and to adjust the irradiation position to be positioned at the target position of the electronic component placement unit. As a result, it is possible to more accurately adjust the irradiation direction of the light emitted from the light irradiation unit with respect to the electronic component placement unit.

In the electronic component handler according to the aspect of the invention, it is preferable that there is provided a notification unit which notifies that the irradiation position is at a predetermined position.

With this configuration, when adjusting the irradiation direction of the light, it is possible to adjust the position or the posture of the light irradiation unit while confirming the information notified from the notification unit that the irradiation position is at the predetermined position. Accordingly, it is possible to grasp the irradiation position regardless of the size and type of the electronic component placement unit, and to adjust the irradiation position to be positioned at the target position of the electronic component placement unit. As a result, it is possible to accurately adjust the irradiation direction of the light emitted from the light irradiation unit with respect to the electronic component placement unit.

In the electronic component handler according to the aspect of the invention, it is preferable that the electronic component placement unit has a recess portion in which the electronic component is accommodated and placed, and the notification unit makes a first notification when the irradiation position is in a first region including the recess portion and makes a second notification when the irradiation position is in a second region which is on the outside of the first region and on the electronic component placement unit.

With this configuration, by distinguishing and recognizing the first notification and the second notification, it is possible to accurately grasp where the irradiation position of the light is positioned.

In the electronic component handler according to the aspect of the invention, it is preferable that the notification unit emits sound, and the first notification and the second notification are different in sound.

With this configuration, it is possible to identify the first notification and the second notification accurately.

In the electronic component handler according to the aspect of the invention, it is preferable that the notification unit makes a third notification when the irradiation position is in a third region on the outside of the electronic component placement unit.

With this configuration, by distinguishing and recognizing the first notification, the second notification, and the third notification, it is possible to more accurately grasp where the irradiation position of the light is positioned.

In the electronic component handler according to the aspect of the invention, it is preferable that the adjustment of the irradiation direction is possible by adjusting at least one of a height in a perpendicular direction of the light irradiation unit and an angle with respect to the perpendicular direction of the light irradiation unit.

With this configuration, it is possible to adjust the irradiation direction of the light promptly and easily.

In the electronic component handler according to the aspect of the invention, it is preferable that the projection shape has a line shape, and a linear center line in a width direction is the irradiation position.

With this configuration, regardless of the magnitude of the linear width, the irradiation position can be determined.

In the electronic component handler according to the aspect of the invention, it is preferable that the adjustment of the irradiation direction is performed prior to the determination processing.

With this configuration, even in a case where the electronic component placement unit is exchanged in accordance with the type of the electronic component, it is possible to accurately detect the presence or absence of the electronic component in the electronic component placement unit.

In the electronic component handler according to the aspect of the invention, it is preferable that the electronic component placement unit is a test unit which is capable of testing the electronic component placed thereon.

In the test unit, prior to the test of the electronic component, there is a case where the presence or absence of the electronic component, that is, the remaining electronic component, is detected. Therefore, it is particularly preferable to adjust the irradiation direction of the light from the light irradiation unit used in the detection of the remaining state with respect to the electronic component placement unit while confirming the image displayed on the display unit for accurately performing the detection of the remaining state.

An electronic component handler according to another aspect of the invention includes: a transport unit which transports an electronic component; a region where an electronic component placement unit on which the electronic component is placed is capable of being disposed; a light irradiation unit which is capable of emitting light and capable of adjusting an irradiation direction of the light with respect to the electronic component placement unit; a processing unit which performs determination processing about the presence or absence of the electronic component in the electronic component placement unit based on at least one of a projection shape and an irradiation position on the electronic component placement unit of the light projected to the electronic component placement unit; and a notification unit which notifies that the irradiation position is at a predetermined position.

With this configuration, when adjusting the irradiation direction of the light, it is possible to adjust the position or the posture of the light irradiation unit while confirming the information notified from the notification unit that the irradiation position is at the predetermined position. Accordingly, it is possible to grasp the irradiation position regardless of the size and type of the electronic component placement unit, and to adjust the irradiation position to be positioned at the target position of the electronic component placement unit. As a result, it is possible to accurately adjust the irradiation direction of the light emitted from the light irradiation unit with respect to the electronic component placement unit.

In the electronic component handler according to the aspect of the invention, it is preferable that a detection unit which detects the irradiation position based on a height in a perpendicular direction of the light irradiation unit and an angle with respect to the perpendicular direction of the light irradiation unit, is further provided. Accordingly, the irradiation position can be detected promptly and accurately.

An electronic component tester according to another aspect of the invention includes: a transport unit which transports an electronic component; an electronic component placement unit on which the electronic component is placed; a region where the electronic component placement unit is capable of being disposed; a light irradiation unit which is capable of emitting light and capable of adjusting an irradiation direction of the light with respect to the electronic component placement unit; a processing unit which performs determination processing about the presence or absence of the electronic component in the electronic component placement unit based on at least one of a projection shape and an irradiation position of the light projected to the electronic component placement unit; and a display unit which displays an image having the projection shape, in which the electronic component placement unit is a test unit which is capable of testing the electronic component placed thereon.

With this configuration, when adjusting the irradiation direction of the light, it is possible to adjust the position or the posture of the light irradiation unit while confirming the screen including the image having the projection shape on the test unit of the light. Accordingly, it is possible to grasp the irradiation position regardless of the size and type of the test unit, and to adjust the irradiation position to be positioned at the target position of the test unit. As a result, it is possible to accurately adjust the irradiation direction of the light emitted from the light irradiation unit with respect to the test unit.

In addition, it is possible to transport the electronic component to the electronic component placement unit that serves as the test unit, and thus, to perform the test with respect to the electronic component by the test unit. In addition, it is possible to transport the electronic component after the test from the test unit.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an electronic component handler and an electronic component tester according to the invention will be described in detail based on appropriate embodiments illustrated in the attached drawings.

First Embodiment

Figure 1:
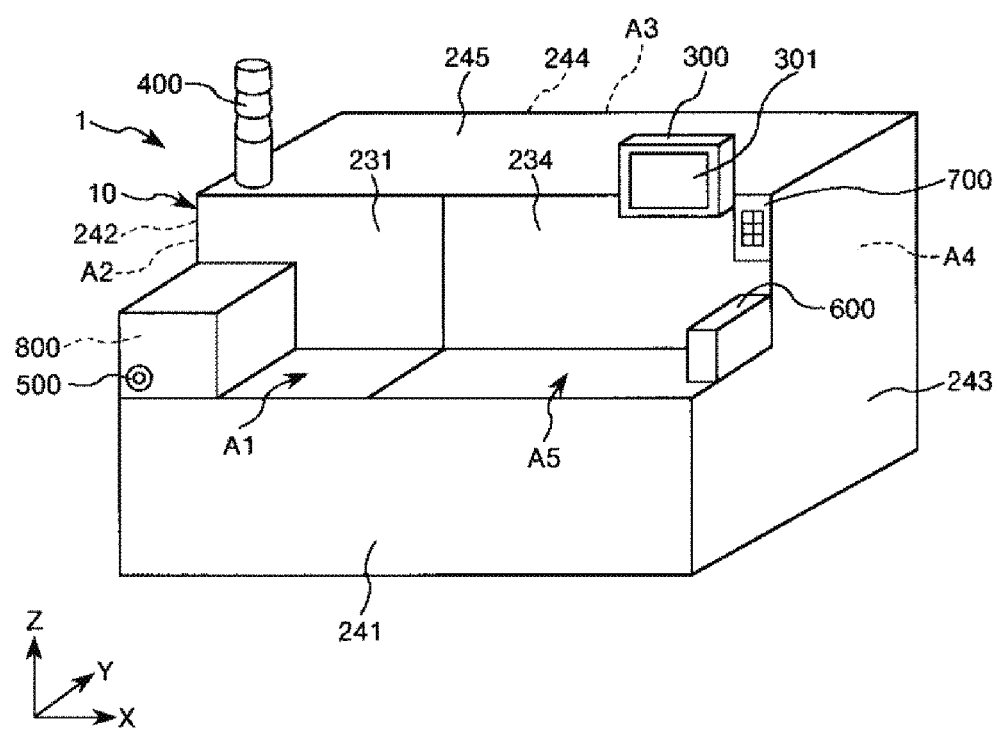
FIG. 1 is a schematic perspective view when a first embodiment of an electronic component tester according to the invention is viewed from a front side.

Hereinafter, a first embodiment of the electronic component handler and the electronic component tester according to the invention will be described with reference to FIGS. 1 to 14. In addition, hereinafter, for the convenience of the description, as illustrated in FIG. 1, three axes which are orthogonal to each other are an X-axis, a Y-axis, and a Z-axis. In addition, an XY plane including the X-axis and the Y-axis is horizontal, and the Z-axis is perpendicular. In addition, a direction parallel to the X-axis is also referred to as "X direction (first direction)", a direction parallel to the Y-axis is also referred to as "Y direction (second direction)", and a direction parallel to the Z-axis is also referred to as "Z direction (third direction)". In addition, a direction in which arrows of each direction are oriented is "positive", and a direction opposite thereto is "negative". In addition, "horizontal" referred in the specification is not limited to a complete horizontal state, and also includes a state of being slightly (for example, a degree which is less than 5°) inclined with respect to the horizontal state as long as transport of an electronic component is not interrupted. In addition, an upper side, that is, a positive side in the Z-axis direction in FIGS. 1, 4, 6, and 8 to 11 (similar in FIGS. 19 to 23) is referred to as "up" or "upper part", and a lower side, that is, a negative side in the Z-axis direction is referred to as "down" or "lower part".

An electronic component handler 10 according to the invention has an external appearance illustrated in FIG. 1. The electronic component handler 10 according to the invention is a handler, and includes: a transport unit 25 which transports an electronic component; a test region A3 (region) where a test unit 16 which is an electronic component placement unit on which the electronic component is placed is capable of being disposed; a light irradiation unit 4 which is capable of emitting laser light $L_{41}$ (light) and capable of adjusting an irradiation direction of the laser light $L_{41}$ (light) with respect to the test unit 16 (electronic component placement unit); a control unit 800 that serves as a processing unit which performs determination processing about the presence or absence of the electronic component in the test unit 16 (electronic component placement unit) based on at least one of a projection shape (irradiation shape) and an irradiation position on the test unit 16 (electronic component placement unit) of the laser light $L_{41}$ (light) projected to the test unit 16 (electronic component placement unit); and a monitor 300 that serves as a display unit which displays an image having the projection shape.

Accordingly, as will be described later, when adjusting the irradiation direction of the laser light $L_{41}$, it is possible to adjust the position or the posture of the light irradiation unit 4 while confirming a screen 6 including an image (enlarged image) having the projection shape on the test unit 16 of the laser light $L_{41}$. Accordingly, it is possible to grasp the test unit 16 regardless of the size and type of the test unit 16, and to adjust the irradiation position to be positioned at the target position of the test unit 16. As a result, it is possible to accurately adjust the irradiation direction of the laser light $L_{41}$ emitted from the light irradiation unit 4 with respect to the test unit 16.

Figure 2:
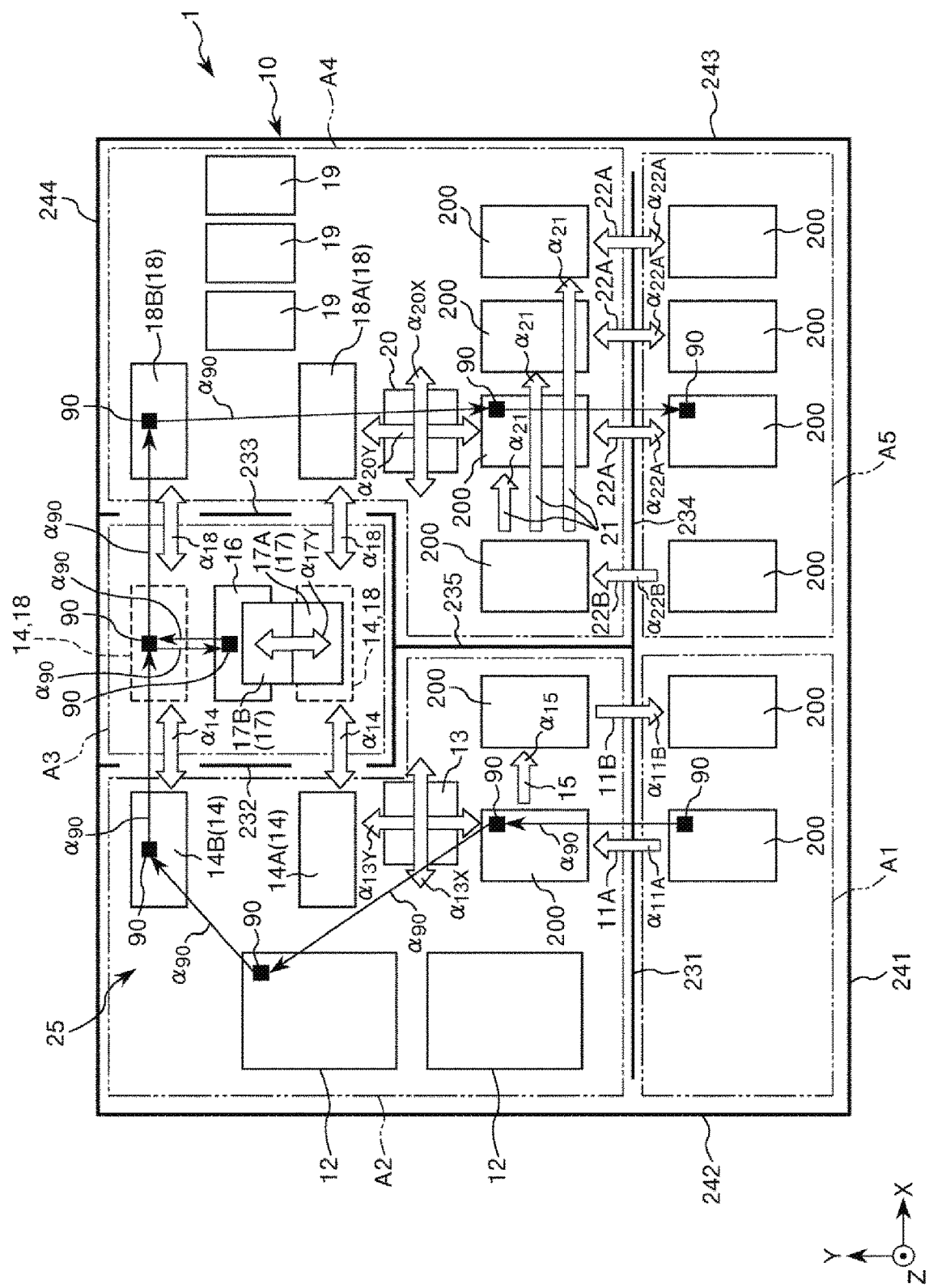
FIG. 2 is a schematic plan view illustrating an operation state of the electronic component tester illustrated in FIG. 1.

In addition, as illustrated in FIG. 2, an electronic component tester 1 according to the invention includes: the transport unit 25 which transports the electronic component; the test unit 16 which is the electronic component placement unit on which the electronic component is placed; the test region A3 (region) where the test unit 16 (electronic component placement unit) is capable of being disposed; the light irradiation unit 4 which is capable of emitting laser light $L_{41}$ (light) and capable of adjusting the irradiation direction of the laser light $L_{41}$ (light) with respect to the test unit 16 (electronic component placement unit); the control unit 800 that serves as the processing unit which performs the determination processing about the presence or absence of the electronic component in the test unit 16 (electronic component placement unit) based on at least one of the projection shape and the irradiation position on the test unit 16 (electronic component placement unit) of the laser light $L_{41}$ (light) projected to the test unit 16 (electronic component placement unit); and the monitor 300 that serves as the display unit which displays the image having the projection shape. As described above, the electronic component placement unit is the test unit 16 that can test the electronic components placed thereon.

Accordingly, the electronic component tester 1 having an advantage of the above-described electronic component handler 10 is obtained. In addition, it is possible to transport the electronic component to the test unit 16, and thus, to perform the test with respect to the electronic component by the test unit 16. In addition, it is possible to transport the electronic component after the test from the test unit 16.

Hereinafter, configurations of each portion will be described in detail.

As illustrated in FIGS. 1 and 2, the electronic component tester 1 having the electronic component handler 10 is an apparatus which transports the electronic component, such as an IC device, which is a ball grid array (BGA) package, and inspects and tests (hereinafter, simply referred to as "test") electric characteristics of the electronic component in the transport process. In addition, hereinafter, for the convenience of the description, a case where the IC device which functions as the electronic component is used will be described as a representative example, and this will be referred to as "IC device 90". The IC device 90 has a shape of a flat plate in the embodiment.

In addition to the description above, examples of the IC device include "large scale integration (LSI)", "complementary MOS (CMOS)", "charge coupled device (CCD)", "module IC" in which the plurality of IC devices are made as a module package, "quartz device", "pressure sensor", "inertial sensor (acceleration sensor)", "gyro sensor", and "fingerprint sensor".

The electronic component tester 1 (electronic component handler 10) includes a tray supply region A1, a device supply region A2, a test region A3, a device collect region A4, and a tray remove region A5, and the regions are divided by each of wall portions as will be described later. In addition, the IC device 90 is tested in the test region A3 in the middle of the path via each of the regions from the tray supply region A1 to the tray remove region A5 in order in an arrow $\alpha_{90}$ direction. In this manner, the electronic component tester 1 includes the electronic component handler 10 including the transport unit 25 which transports the IC device 90 via each of the regions, the test unit 16 which performs the test in the test region A3, and the control unit 800. In addition to this, the electronic component tester 1 includes the monitor 300, a signal lamp 400, and an operation panel 700.

In addition, the electronic component tester 1 is used while a part at which the tray supply region A1 and the tray remove region A5 are disposed, that is, a lower side in FIG. 2 is a front side, and a part in which the test region A3 is disposed, that is, an upper side in FIG. 2 is a rear side.

In addition, the electronic component tester 1 is used with a so-called "change kit" which is exchanged for each type of the IC device 90 being loaded thereon in advance. In this change kit, there is a placing unit (electronic component placement unit) on which the IC device 90 (electronic component) is placed. In the electronic component tester 1 of the embodiment, the placing unit is installed at a plurality of locations, and includes, for example, a temperature adjustment unit 12, a device supply unit 14, and a device collect unit 18 which will be described later. In addition, as the placing unit (electronic component placement unit) on which the IC device 90 (electronic component) is placed, in addition to the above-described change kit, there are also a tray 200, a tray for collection 19, and the test unit 16 which will be prepared by a user.

The tray supply region A1 is a material supply unit by which the tray 200 on which the plurality of IC devices 90 in a state of not being tested are arranged is supplied. It can be said that the tray supply region A1 is a loading region in which the plurality of trays 200 can be stacked and loaded. In addition, in the embodiment, in each of the trays 200, a plurality of recess portions (pockets) are disposed in rows and columns. Each of the recess portions can accommodate and place the IC devices 90 one by one.

The device supply region A2 is a region through which the plurality of IC devices 90 on the tray 200 transported from the tray supply region A1 are respectively transported and supplied to the test region A3. In addition, tray transport mechanisms 11A and 11B which transport the trays 200 in the horizontal direction one by one are provided to go across the tray supply region A1 and the device supply region A2. The tray transport mechanism 11A is a part of the transport unit 25, and the tray 200 can be moved to the positive side in the Y direction for each of the IC devices 90 placed on the tray 200, that is, in an arrow $\alpha_{11A}$ direction in FIG. 2. Accordingly, it is possible to stably send the IC device 90 into the device supply region A2. In addition, the tray transport mechanism 11B is a moving unit which can move the empty tray 200 to the negative side in the Y direction, that is, in an arrow $\alpha_{11B}$ direction in FIG. 2. Accordingly, it is possible to move the empty tray 200 from the device supply region A2 to the tray supply region A1.

In the device supply region A2, the temperature adjustment unit (soak plate) 12, a device transport head 13, and a tray transport mechanism 15, are provided. In addition, the device supply unit 14 which moves to go across the device supply region A2 and the test region A3 is also provided.

The temperature adjustment unit 12 is a placing unit on which the plurality of IC devices 90 are placed, and is called "soak plate" which can collectively heat or cool the placed IC device 90. By using the soak plate, it is possible to heat or cool the IC device 90 before the test by the test unit 16 in advance, and to adjust the temperature to the temperature appropriate for the test (high temperature test or low temperature test).

The temperature adjustment unit 12 that serves as the placing unit is fixed. Accordingly, it is possible to stably adjust the temperature of the IC device 90 on the temperature adjustment unit 12. In addition, the temperature adjustment unit 12 is grounded.

In the configuration illustrated in FIG. 2, two temperature adjustment units 12 are disposed and fixed in the Y direction. In addition, the IC device 90 on the tray 200 transported in from the tray supply region A1 by the tray transport mechanism 11A is transported to any of the temperature adjustment units 12.

The device transport head 13 holds the IC device 90, is supported to be movable in the X direction and in the Y direction in the device supply region A2, and is further supported to be movable in the Z direction. The device transport head 13 is also a part of the transport unit 25, and can transport the IC device 90 between the tray 200 transported from the tray supply region A1 and the temperature adjustment unit 12 and transport the IC device 90 between the temperature adjustment unit 12 and the device supply unit 14 which will be described later. In addition, in FIG. 2, the movement of the device transport head 13 in the X direction is illustrated as an arrow $\alpha_{13X}$, and the movement of the device transport head 13 in the Y direction is illustrated as an arrow $\alpha_{13Y}$.

The device supply unit 14 is a placing unit on which the IC device 90 of which the temperature is adjusted by the temperature adjustment unit 12 is placed, and is also called "shuttle plate for supply" or simply "supply shuttle" which can transport the IC device 90 to the vicinity of the test unit 16. The device supply unit 14 can also be a part of the transport unit 25. The device supply unit 14 has a recess portion (pocket) in which the IC device 90 is accommodated and placed.

In addition, the device supply unit 14 that serves as the placing unit is supported to be capable of reciprocating (moving) between the device supply region A2 and the test region A3 along the X direction, that is, along an arrow $\alpha_{14}$ direction. Accordingly, the device supply unit 14 can stably transport the IC device 90 from the device supply region A2 to the vicinity of the test unit 16 of the test region A3, and can return to the device supply region A2 again after the IC device 90 is removed by a device transport head 17 in the test region A3.

In the configuration illustrated in FIG. 2, two device supply units 14 are disposed in the Y direction, the device supply unit 14 on the negative side in the Y direction is called "device supply unit 14A", and the device supply unit 14 on the positive side in the Y direction is called "device supply unit 14B". In addition, the IC device 90 on the temperature adjustment unit 12 is transported to the device supply unit 14A or the device supply unit 14B in the device supply region A2. In addition, similar to the temperature adjustment unit 12, the device supply unit 14 is configured to be capable of heating or cooling the IC device 90 placed on the device supply unit 14. Accordingly, it is possible to maintain the temperature adjustment state of the IC device 90 of which the temperature is adjusted by the temperature adjustment unit 12, and to transport the IC device 90 to the vicinity of the test unit 16 of the test region A3. In addition, similar to the temperature adjustment unit 12, the device supply unit 14 is also grounded.

The tray transport mechanism 15 is a mechanism which transports the empty tray 200 in a state where all of the IC devices 90 are removed to the positive side in the X direction in the device supply region A2, that is, in an arrow $\alpha_{15}$ direction. In addition, after the transport, the empty tray 200 returns to the tray supply region A1 from the device supply region A2 by the tray transport mechanism 11B.

The test region A3 is a region in which the IC device 90 is tested. In the test region A3, the test unit 16 which performs the test with respect to the IC device 90, and the device transport head 17 are provided.

Figure 4:
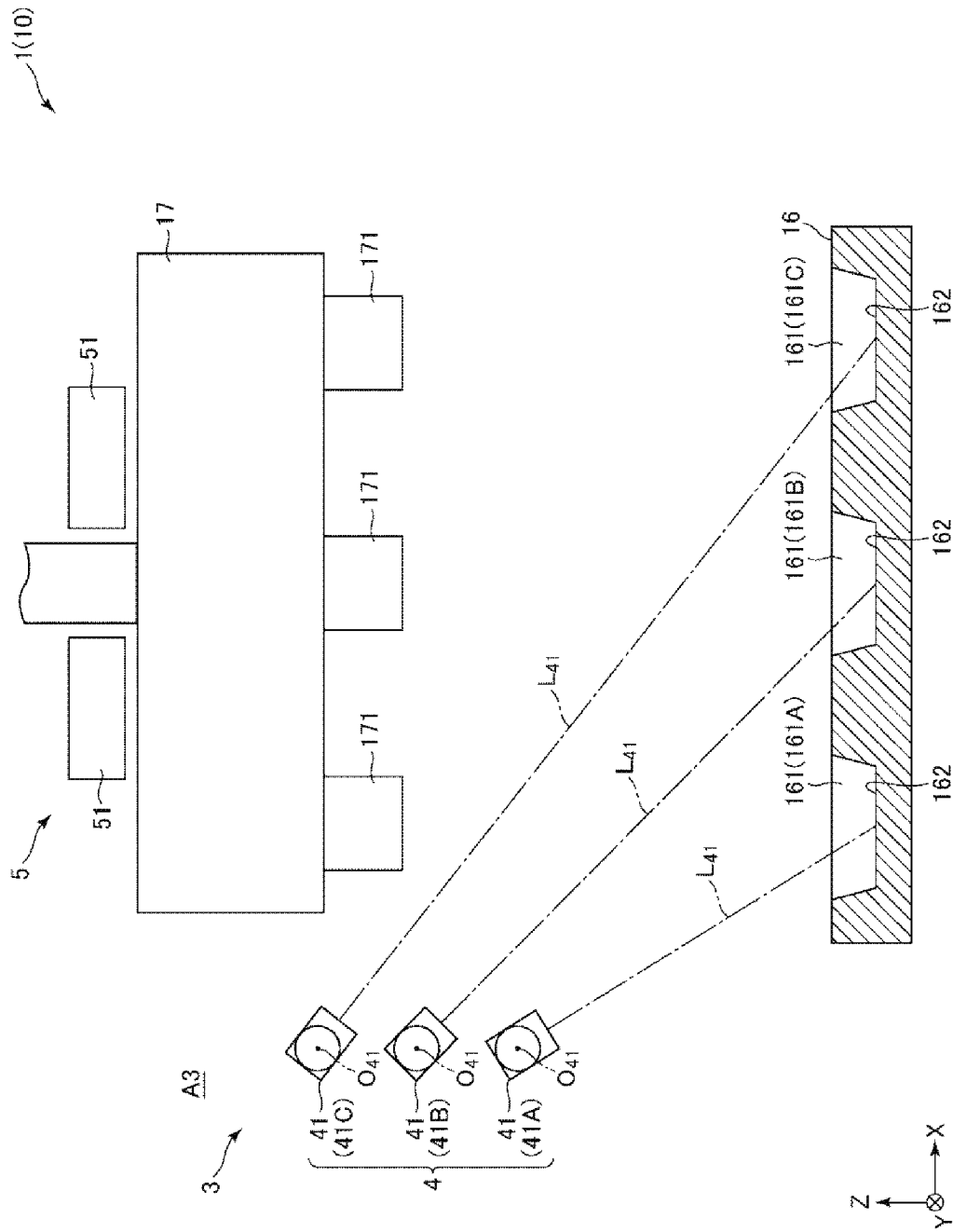
FIG. 4 is a partial sectional view when viewed from a direction of an arrow A in FIG. 3.

The device transport head 17 is a part of the transport unit 25, and is configured to be capable of heating and cooling the held IC device 90 similar to the temperature adjustment unit 12. As illustrated in FIG. 4, the device transport head 17 has a holding unit 171 for holding the IC device 90 (electronic component) by suction in the lower portion thereof. Accordingly, it is possible to transport the IC device 90 in the test region A3 while holding the IC device 90 maintained in the temperature adjustment state and maintaining the temperature adjustment state. In addition, the number of installations of the holding units 171 is not limited to that illustrated in FIG. 4.

The device transport head 17 is a part of a mechanism which is supported to be capable of reciprocating in the Y direction and in the Z direction in the test region A3, and is called "index arm". Accordingly, the device transport head 17 can transport and place the IC device 90 onto the test unit 16 by lifting up the IC device 90 from the device supply unit 14 transported from the device supply region A2.

Figure 3:
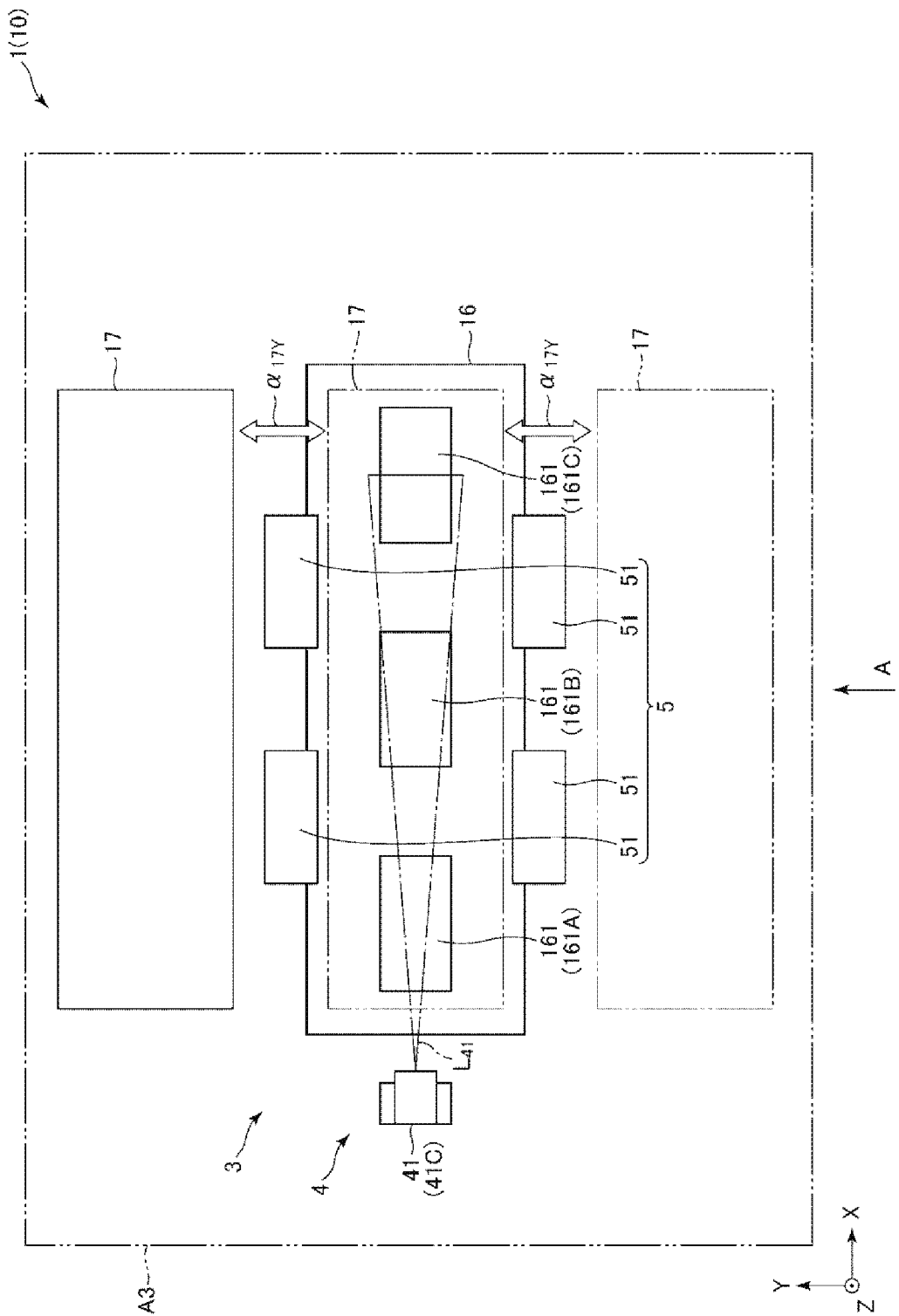
FIG. 3 is an enlarged detailed plan view in a test region in FIG. 2.

In addition, in FIGS. 2 and 3, the reciprocating movement of the device transport head 17 in the Y direction is illustrated by an arrow $\alpha_{17Y}$. In addition, as illustrated in FIG. 3, in the test region A3, the device transport head 17 can be responsible for the transport of the IC device 90 from the device supply unit 14A to the test unit 16 (refer to the device transport head 17 indicated by the solid line on the upper side and the device transport head 17 indicated by the two-dot chain line at the center in FIG. 3), and the transport of the IC device 90 from the device supply unit 14B to the test unit 16 (refer to the device transport head 17 indicated by the two-dot chain line on the lower side and the device transport head 17 indicated by the two-dot chain line at the center in FIG. 3). In addition, the device transport head 17 is supported to be capable of reciprocating in the Y direction, but not being limited thereto, the device transport head 17 may also be supported to be capable of reciprocating in the X direction.

The test unit 16 (socket) is a placing unit (electronic component placement unit) on which the IC device 90 which is the electronic component is placed and tests the electric characteristics of the IC device 90. As illustrated in FIGS. 3 and 4, the test unit 16 has a recess portion (pocket) 161 in which the IC device 90 is accommodated and placed, and a plurality of probe pins (not illustrated) are provided on the bottom surface 162 of the recess portion 161. In addition, as a terminal of the IC device 90 and the probe pin are electrically connected to each other to be conducted, that is, come into contact with each other, the IC device 90 can be tested. The test of the IC device 90 is performed based on a program which is stored in a test control unit including a tester connected to the test unit 16.

In addition, in the embodiment, as an example, three recess portions 161 are disposed at intervals in the X direction as illustrated in FIG. 3, and there is a case where the recess portions 161 are referred to as "recess portions 161A, "recess portion 161B", and "recess portion 161C" in order from a negative side in the X direction. Further, a disposition form (the number of dispositions in the X direction and the number of dispositions in the Y direction) and the total number of the dispositions of the recess portions 161 are not limited to those illustrated in FIG. 3.

In addition, in the test unit 16, similar to the temperature adjustment unit 12, the IC device 90 can be heated or cooled, and the temperature of the IC device 90 can be adjusted to the temperature appropriate for the test.

The device collect region A4 is a region in which the plurality of IC devices 90 which are tested in the test region A3 and of which the test is finished are collected. In the device collect region A4, the tray for collection 19, a device transport head 20, and a tray transport mechanism 21 are provided. In addition, the device collect unit 18 which moves to go through the test region A3 and the device collect region A4 is also provided. In addition, in the device collect region A4, the empty tray 200 is also prepared.

The device collect unit 18 is a placing unit on which the IC device 90 of which the test is finished by the test unit 16 is placed, and which can transport the IC device 90 to the device collect region A4, and is called "shuttle plate for collection" or simply "collect shuttle". The device collect unit 18 can also be a part of the transport unit 25.

In addition, the device collect unit 18 is supported to be capable of reciprocating in the X direction between the test region A3 and the device collect region A4, that is, along an arrow $\alpha_{18}$ direction. In addition, in the configuration illustrated in FIG. 2, similar to the device supply unit 14, two device collect units 18 are disposed in the Y direction, the device collect unit 18 on the negative side in the Y direction is called "device collect unit 18A", and the device collect unit 18 on the positive side in the Y direction is called "device collect unit 18B". In addition, the IC device 90 on the test unit 16 is transported and placed to the device collect unit 18A or the device collect unit 18B. In addition, as illustrated in FIG. 3, in the test region A3, the device transport head 17 can be responsible for the transport of the IC device 90 from the test unit 16 to the device collect unit 18A (refer to the device transport head 17 indicated by the two-dot chain line at the center and the device transport head 17 indicated by the solid line on the upper side in FIG. 3), and the transport of the IC device 90 from the test unit 16 to the device collect unit 18B (refer to the device transport head 17 indicated by the two-dot chain line at the center and the device transport head 17 indicated by the two-dot chain line on the lower side in FIG. 3). In addition, similar to the temperature adjustment unit 12 or the device supply unit 14, the device collect unit 18 is also grounded.

The tray for collection 19 is a placing unit on which the IC device 90 tested by the test unit 16 is placed, and is fixed not to move in the collect region A4. Accordingly, even in the device collect region A4 in which a relatively large number of various types of movable portions, such as the device transport head 20, are disposed, on the tray for collection 19, the IC device 90 which is already tested is stably placed. In addition, in the configuration illustrated in FIG. 2, three trays for collection 19 are disposed along the X direction.

In addition, three empty trays 200 are disposed along the X direction. The empty tray 200 is also a placing unit on which the IC device 90 tested by the test unit 16 is placed. In addition, the IC device 90 on the device collect unit 18 that has moved to the device collect region A4 is transported and placed to any of the tray for collection 19 and the empty tray 200. Accordingly, the IC device 90 is classified for each of the test result, and is collected.

The device transport head 20 is supported to be movable in the X direction and in the Y direction in the device collect region A4, and further has a part that can also move in the Z direction. The device transport head 20 is a part of the transport unit 25, and can transport the IC device 90 to the tray for collection 19 or the empty tray 200 from the device collect unit 18. In addition, in FIG. 2, the movement of the device transport head 20 in the X direction is illustrated by an arrow $\alpha_{20X}$, and the movement of the device transport head 20 in the Y direction is illustrated by an arrow $\alpha_{20Y}$.

The tray transport mechanism 21 is a mechanism which transports the empty tray 200 transported from the tray remove region A5 in the X direction in the device collect region A4, that is, in an arrow $\alpha_{21}$ direction. In addition, after the transport, the empty tray 200 can be disposed at a position at which the IC device 90 is collected, that is, can be any of the three empty trays 200.

The tray remove region A5 is a material remove unit which collects and removes the tray 200 on which the plurality of IC devices 90 in an tested state are arranged. In the tray remove region A5, it is possible to stack multiple trays 200.

In addition, a tray transport mechanism 22A and a tray transport mechanism 22B which transport the trays 200 in the Y direction one by one are provided to go across the device collect region A4 and the tray remove region A5. The tray transport mechanism 22A is a part of the transport unit 25, and a moving unit which can allow the tray 200 to reciprocate in the Y direction, that is, in an arrow $\alpha_{22A}$ direction. Accordingly, it is possible to transport the IC device 90 that is already tested from the device collect region A4 to the tray remove region A5. In addition, the tray transport mechanism 22B can move the empty tray 200 for collecting the IC device 90 to the positive side in the Y direction, that is, in an arrow $\alpha_{22B}$ direction. Accordingly, it is possible to move the empty tray 200 from the tray remove region A5 to the device collect region A4.

The control unit 800 can control, for example, operations of each portion of the tray transport mechanism 11A, the tray transport mechanism 11B, the temperature adjustment unit 12, the device transport head 13, the device supply unit 14, the tray transport mechanism 15, the test unit 16, the device transport head 17, the device collect unit 18, the device transport head 20, the tray transport mechanism 21, the tray transport mechanism 22A, the tray transport mechanism 22B, and a remaining state detection unit 3 which will be described later.

The operator can set or confirm an operation condition or the like of the electronic component tester 1 via the monitor 300. The monitor 300 includes a display screen 301 configured of, for example, a liquid crystal screen, and is disposed in an upper portion on the front side of the electronic component tester 1. As illustrated in FIG. 1, on a right side in the drawing of the tray remove region A5, a mouse table 600 on which a mouse is placed is provided. The mouse is used when operating the screen displayed on the monitor 300.

In addition, at a lower right part of FIG. 1 with respect to the monitor 300, the operation panel 700 is disposed. In addition to the monitor 300, the operation panel 700 is a panel for commanding a desirable operation to the electronic component tester 1.

In addition, by combining generated colors, the signal lamp 400 can notify the operator of an operation state or the like of the electronic component tester 1. The signal lamp 400 is disposed in an upper portion of the electronic component tester 1. In addition, in the electronic component tester 1, a speaker 500 is embedded, and it is also possible to notify the operator of the operation state or the like of the electronic component tester 1 by the speaker 500.

In the electronic component tester 1, the tray supply region A1 and the device supply region A2 are partitioned by a first partition wall 231, the device supply region A2 and the test region A3 are partitioned by a second partition wall 232, the test region A3 and the device collect region A4 are partitioned by a third partition wall 233, and the device collect region A4 and the tray remove region A5 are partitioned by a fourth partition wall 234. In addition, the device supply region A2 and the device collect region A4 are partitioned by a fifth partition wall 235.

The most exterior of the electronic component tester 1 is covered with a cover, and examples of the cover include a front cover 241, a side cover 242, a side cover 243, a rear cover 244, and a top cover 245.

As described above, the electronic component placement unit in the test region A3 is the test unit 16 that can test the IC device 90 (electronic component) placed thereon. In the electronic component tester 1, when performing the test of the IC device 90 by the test unit 16, prior to the test, the presence or absence of the IC device 90 in the recess portion 161 of the test unit 16, that is, the remaining state of the IC device 90, is detected. The reason for performing the detection of the remaining state is, for example, the following reason.

In a case where the IC device 90 remains in the recess portion 161 of the test unit 16 (hereinafter, the IC device 90 will be referred to as "remaining device"), the next IC device 90 (hereinafter, the IC device 90 will be referred to as "untested device") to which the test is performed in the recess portion 161 overlaps the remaining device and is placed thereon. Under the condition, there is a concern that it is difficult to accurately test the untested device. Therefore, it is preferable that the test unit 16 performs the detection of the remaining state of the IC device 90.

Here, the electronic component tester 1 includes a remaining state detection unit 3 which detects the remaining IC device 90 in the test unit 16. As illustrated in FIGS. 3 and 4, the remaining state detection unit 3 includes the light irradiation unit 4 and a capturing unit 5.

As illustrated in FIG. 4, the light irradiation unit 4 is disposed diagonally upward to the left with respect to the test unit 16, that is, on the negative side in the X direction and the positive side in the Z direction with respect to the test unit 16. In the embodiment, the light irradiation unit 4 is configured with three laser light sources 41. These laser light sources 41 are arranged at intervals along the Z direction, and are sometimes referred to as "laser light source 41A", "laser light source 41B", "laser light source 41C" in order from the negative side in the Z direction.

The laser light source 41A can emit the laser light $L_{41}$ (light) as slit light along the Y direction toward the recess portion 161A of the test unit 16 (electronic component placement unit).

The laser light source 41B can emit the laser light $L_{41}$ (light) as slit light along the Y direction toward the recess portion 161B of the test unit 16 (electronic component placement unit).

The laser light source 41C can emit the laser light $L_{41}$ (light) as slit light along the Y direction toward the recess portion 161C of the test unit 16 (electronic component placement unit).

In addition, the laser light source 41A may emit the laser light $L_{41}$ (light) toward the recess portion 161C, and the laser light source 41C may emit the laser light $L_{41}$ (light) toward the recess portion 161A.

In addition, as each of the laser light sources 41, for example, one having a cylindrical lens or the like can be used. Accordingly, the projection shape of the laser light $L_{41}$ on the test unit 16 becomes linear. In addition, as each of the laser light sources 41, in addition to the above-described ones, for example, one which scans with spot light along the Y direction may be used.

Further, it is preferable that the number of dispositions of the laser light sources 41 is equal to or greater than the number of dispositions of the recess portions 161 along the X direction. In addition, the number of dispositions is three in the embodiment, but the invention is not limited thereto, and for example, the number may be 1, 2, 4 or more.

In addition, the disposition position of the laser light source 41 (light irradiation unit 4) is diagonally upward to the left in the drawing with respect to the test unit 16 in the configuration illustrated in FIG. 4, but the invention is not limited thereto, and for example, the disposition position may be diagonally upward to the right or may be both diagonally upward to the left and diagonally upward to the right.

As illustrated in FIG. 4, the capturing unit 5 is disposed and fixed on the upper side of the test unit 16, that is, on the positive side in the Z direction with respect to the test unit 16. As illustrated in FIG. 3, in the embodiment, the capturing unit 5 is configured with 4 cameras 51. Two of the cameras 51 are arranged in the X direction and two in the Y direction, and the capturing range is different. In addition, by combining the images captured by each of the cameras 51, it is possible to obtain the image of the entire test unit 16.

In addition, each of the cameras 51 is not particularly limited, and for example, a charge-coupled device (CCD) camera, a three-dimensional camera, or the like can be used.

In addition, the number of dispositions of the cameras 51 is 4 in the embodiment, but the invention is not limited thereto, and for example, the number may be 1, 2, 3, 5 or more. Further, a disposition form (the number of dispositions in the X direction and the number of dispositions in the Y direction) of the camera 51 is not limited to that illustrated in FIG. 3.

In addition, although each of the cameras 51 is fixed in the embodiment, the invention is not limited thereto, and for example, the cameras 51 may be rotatably supported. Accordingly, for example, the capturing range of each of the cameras 51 can be changed, and the total number of dispositions of the cameras 51 can be suppressed as much as possible.

In addition, the control unit 800 performs remaining state detection processing of the IC device 90 in each of the recess portions 161 of the test unit 16 (electronic component placement unit), that is, the determination processing of the presence or absence of the IC device 90 (electronic component). The control unit 800 which is the processing unit has at least one processor, the processor reads various instructions, determinations, commands and the like stored in the control unit 800, and the processor performs various instructions, various determinations, various commands and the like. The control unit 800 (processor) can perform the remaining state detection processing based on at least one of the projection shape and the irradiation position of the laser light $L_{41}$ (light) projected to the test unit 16 (electronic component placement unit) on the test unit 16 (electronic component placement unit). Hereinafter, the processing will be described with reference to FIGS. 5 to 8. In FIGS. 5 to 8, one recess portion 161 and the laser light $L_{41}$ emitted to the recess portion 161 are representatively drawn.

Figure 5:
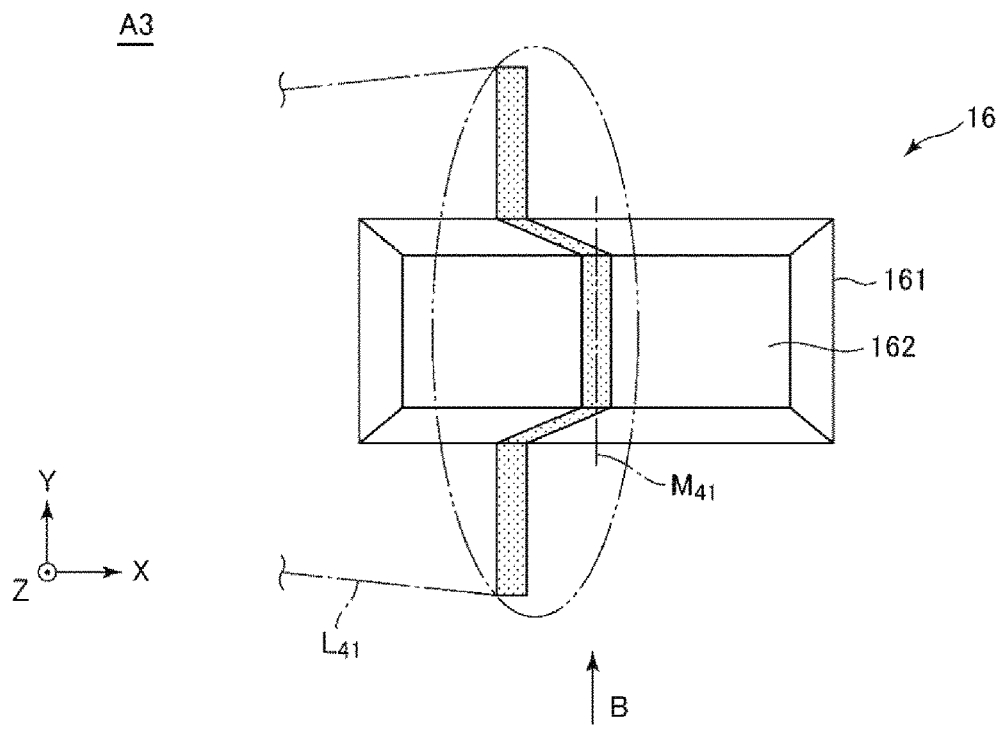
FIG. 5 is a plan view illustrating a state where an IC device is not placed on a test unit disposed in the test region illustrated in FIG. 3.
Figure 6:
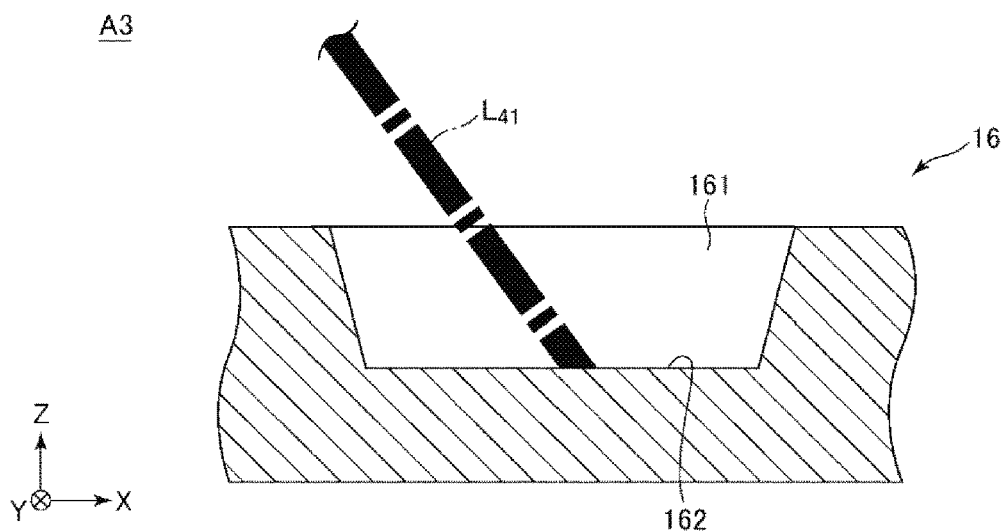
FIG. 6 is a partial sectional view when viewed from a direction of an arrow B in FIG. 5.

As illustrated in FIGS. 5 and 6, in a state where the IC device 90 is not placed in the recess portion 161, the laser light $L_{41}$ reaches the bottom surface 162 of the recess portion 161. In addition, the projection shape of the laser light $L_{41}$ on the test unit 16 at this time has a curved linear shape (line shape) as illustrated in FIG. 5 (refer the part surrounded by the two-dot chain line in FIG. 5). In addition, the projection shape of the laser light $L_{41}$ illustrated in FIG. 5 is captured by the capturing unit 5 as an image and stored in the storage unit of the control unit 800 in advance.

Figure 7:
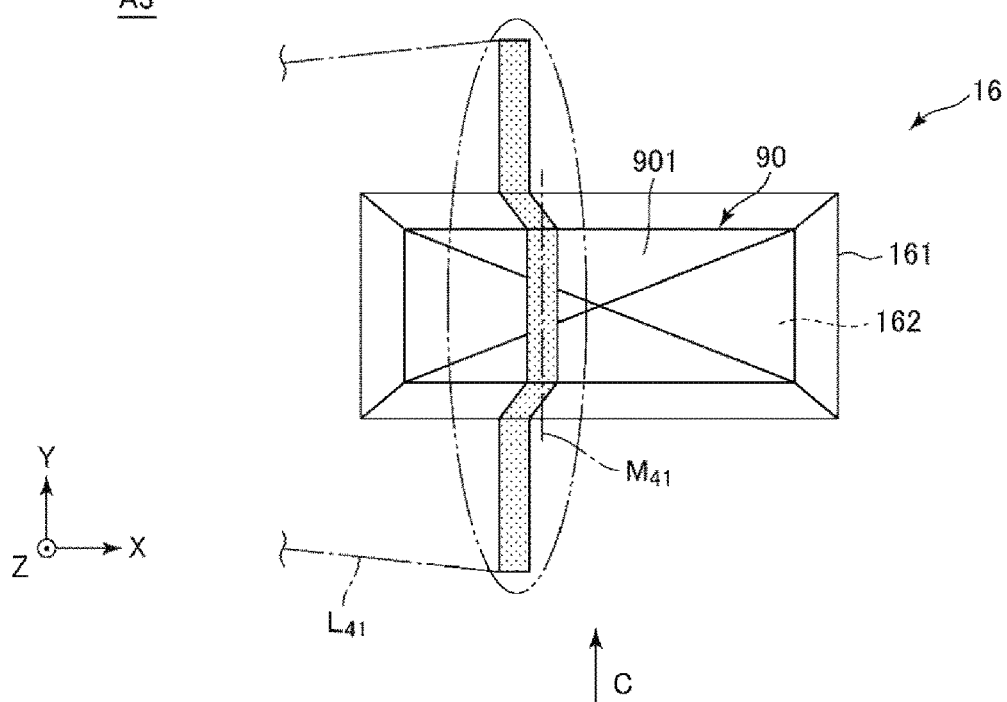
FIG. 7 is a plan view illustrating a state where the IC device is placed on the test unit disposed in the test region illustrated in FIG. 3.
Figure 8:
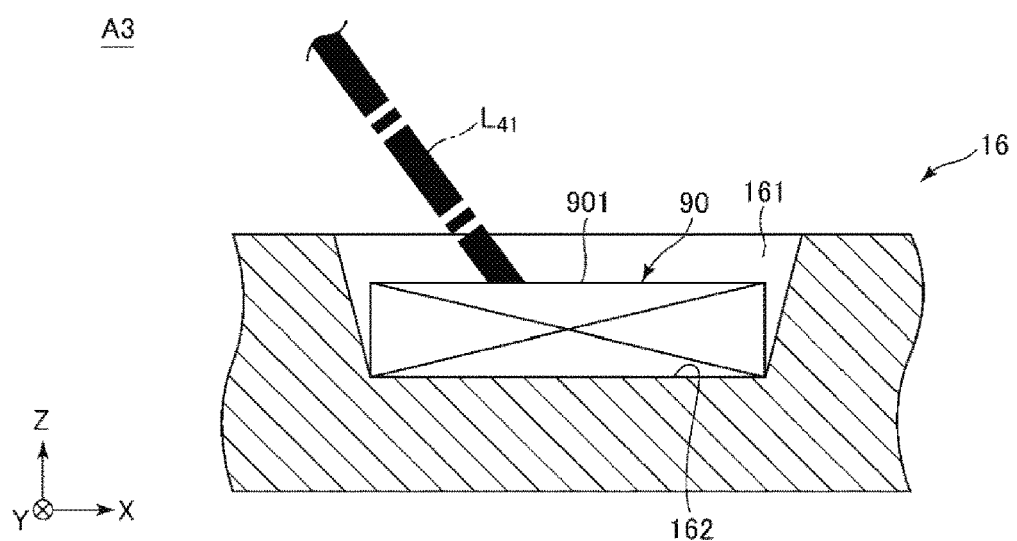
FIG. 8 is a partial sectional view when viewed from a direction of an arrow C in FIG. 7.

Meanwhile, as illustrated in FIGS. 7 and 8, in a state where the IC device 90 is placed in the recess portion 161, the laser light $L_{41}$ does not reach the bottom surface 162 of the recess portion 161 and reaches an upper surface 901 of the IC device 90 in the recess portion 161. In addition, the projection shape of the laser light $L_{41}$ on the test unit 16 at this time is different from the projection shape of the laser light $L_{41}$ illustrated in FIG. 5 by the amount of the IC device 90 placed in the recess portion 161, and has a curved linear shape as illustrated in FIG. 7 (refer to a part surrounded by the two-dot chain line in FIG. 7). In addition, the projection shape of the laser light $L_{41}$ illustrated in FIG. 7 is captured by the capturing unit 5 as an image and stored in the storage unit of the control unit 800 in advance.

When the remaining state detection is actually performed, the recess portion 161 to which the remaining state detection is to be performed is irradiated with the laser light $L_{41}$, and the projection shape of the laser light $L_{41}$ is captured by the capturing unit 5. In addition, by determining that the projection shape of the laser light $L_{41}$ projected on the recess portion 161 to which the remaining state detection is to be performed is close to either the projection shape of the laser light $L_{41}$ illustrated in FIG. 5 or the projection shape of the laser light $L_{41}$ illustrated in FIG. 7 through comparison, it is determined whether or not the IC device 90 remains. In addition, as a method of determining whether or not the IC device 90 remains, in the embodiment, a method of comparing the projection shapes of the laser light $L_{41}$ is employed as described above, but the invention is not limited thereto.

Figure 9:
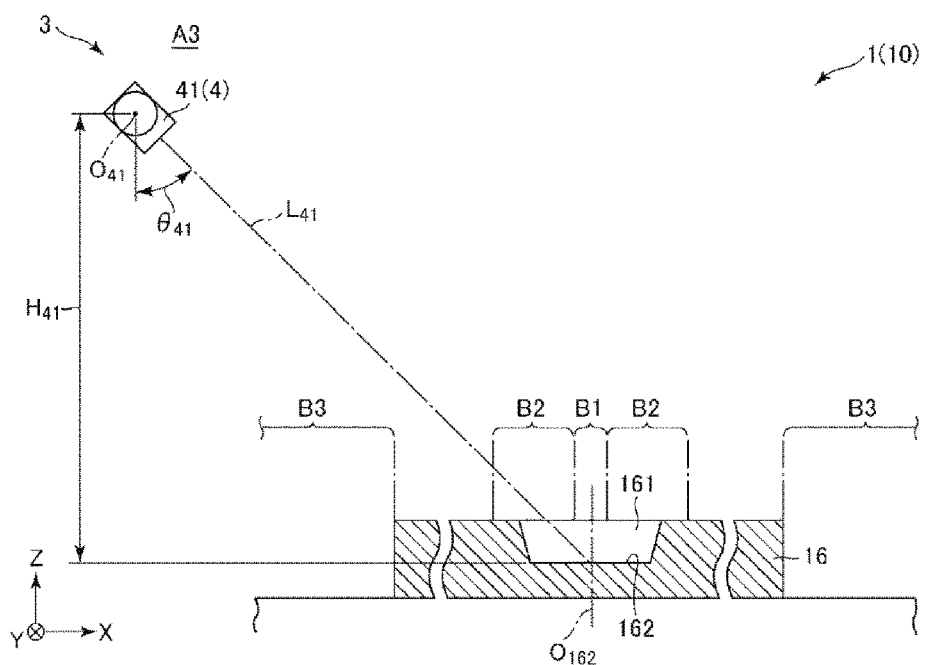
FIG. 9 is a partial sectional view illustrating an example of a state where a position of the light to be emitted to the test unit disposed in the test region illustrated in FIG. 3 is being adjusted.
Figure 10:
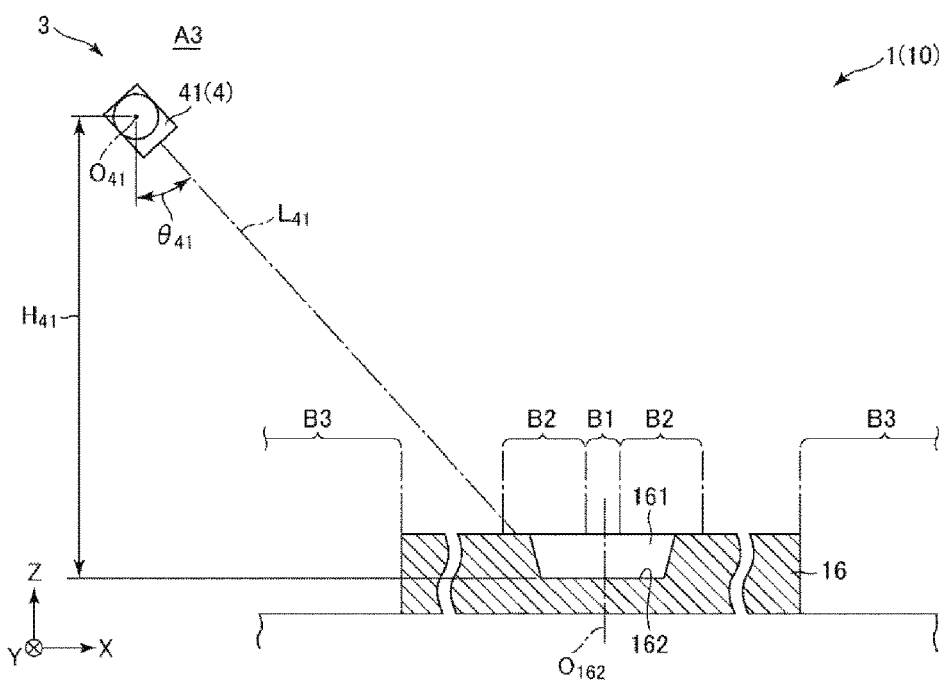
FIG. 10 is a partial sectional view illustrating an example of a state where the position of the light to be emitted to the test unit disposed in the test region illustrated in FIG. 3 is being adjusted.
Figure 11:
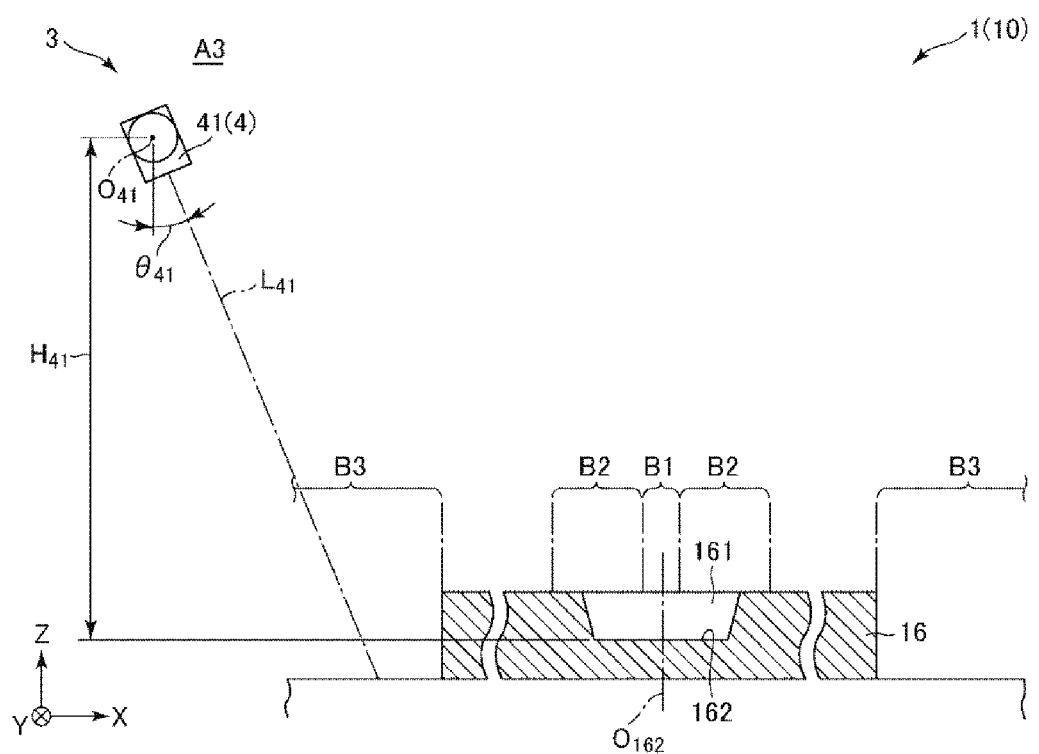
FIG. 11 is a partial sectional view illustrating an example of a state where the position of the light to be emitted to the test unit disposed in the test region illustrated in FIG. 3 is being adjusted.

Incidentally, depending on the type of the IC device 90, for example, there is a case where the test unit 16 has a different disposition number of the recess portions 161 or disposition form (pitch between the recess portions 161 arranged in the X direction, and the like). In this case, it is necessary to adjust the irradiation direction of the laser light $L_{41}$ directed toward the recess portion 161. Hereinafter, the adjustment will be described mainly with reference to FIGS. 9 to 14. In FIGS. 9 to 11, one recess portion 161 and the laser light $L_{41}$ emitted to the recess portion 161 are representatively drawn.

In the electronic component tester 1, the adjustment of the irradiation direction of the laser light $L_{41}$ is performed prior to the remaining state detection processing of the IC device 90 in the test unit 16 (determination processing of the presence or absence of the IC device 90). Accordingly, even in a case where the test unit 16 is exchanged in accordance with the type of the IC device 90, it is possible to accurately detect whether or not the IC device 90 remains in the recess portion 161 of the test unit 16.

In the embodiment, the adjustment of the irradiation direction of the laser light $L_{41}$ is performed manually, that is, by directly touching each of the laser light sources 41 manually. Each of the laser light sources 41 is rotatably supported around a rotation axis $O_{41}$ parallel to the Y axis. In addition, each of the laser light sources is configured to maintain the state thereof as it is after being rotated.

In addition, the adjustment of the irradiation direction of the laser light $L_{41}$ is possible by adjusting at least one of a height $H_{41}$ in the Z direction (perpendicular direction) of the laser light source 41 (light irradiation unit) from the bottom surface 162 of the recess portion 161 and a rotation angle (angle) $\theta_{41}$ with respect to the Z axis (perpendicular direction) of the laser light source 41 (light irradiation unit). In addition, in the embodiment, the rotation angle $\theta_{41}$ of the laser light source 41 is adjusted. Accordingly, it is possible to adjust the irradiation direction of the laser light $L_{41}$ promptly and easily.

In addition, in the embodiment, the adjustment of the irradiation direction of the laser light $L_{41}$ is performed by adjusting the rotation angle $\theta_{41}$ of the laser light source 41. However, the invention is not limited thereto, and for example, the adjustment of the irradiation direction of the laser light $L_{41}$ may be performed by adjusting the height $H_{41}$ of the laser light source 41, or may be performed by adjusting both the rotation angle $\theta_{41}$ and the height $H_{41}$.

As illustrated in FIG. 9, it is preferable that the irradiation direction of the laser light $L_{41}$ is adjusted such that the irradiation position of the laser light $L_{41}$ on the test unit 16 is a first region B1 including the recess portion 161, and particularly in the first region B1, it is more preferable to adjust so as to be a center portion $O_{162}$ in the X direction of the bottom surface 162 of the recess portion 161. In addition, although the length in the X direction of the first region B1 is not particularly limited, for example, it is preferable that the length is 1% or more and 10% or less, and it is more preferable that the length is 5% or more and 10% or less of the length in the X direction of the IC device 90 accommodated in the recess portion 161.

In addition, in the process of adjusting the irradiation direction of the laser light $L_{41}$, there is also a case where the state illustrated in FIG. 10 or the state illustrated in FIG. 11 is achieved.

In the state illustrated in FIG. 10, the irradiation position of the laser light $L_{41}$ is in a second region B2 which is on the outside of the first region B1 and on the test unit 16 (electronic component placement unit). In addition, the second region B2 is set at two locations through the first region B1. Although the length in the X direction of each of the second regions B2 is not particularly limited, for example, it is preferable that the length in the X direction of the first region B1 is 100% or more and 200% or less, and it is more preferable that the length is 100% or more and 150% or less.

In the state illustrated in FIG. 11, the irradiation position of the laser light $L_{41}$ is in a third region B3 on the outside of the test unit 16 (electronic component placement unit). In addition, the third region B3 is set at two locations through the test unit 16.

As described above, the laser light $L_{41}$ is the slit beam, and the projection shape thereof is a curved linear shape (refer to FIGS. 5 and 7). In this case, a linear center line $M_{41}$ in the width direction is set as the irradiation position of the laser light $L_{41}$. Accordingly, regardless of the magnitude of the width on the test unit of the slit light, the irradiation position can be determined.

Further, it is preferable that the width on the test unit 16 of the slit light is 0.3 mm or more and 1 mm or less, and it is more preferable that the width is 0.3 mm or more and 0.5 mm or less.

In addition, a method of detecting the center line $M_{41}$ is not particularly limited, and for example, a method of detecting (measuring) the luminance distribution on the test unit 16 of the slit light and setting the part with the highest luminance as the center line $M_{41}$, or the like, is employed.

Further, as the irradiation position of the laser light $L_{41}$, the linear center line $M_{41}$ in the width direction is set, but the invention is not limited thereto. For example, in a case where the size of the recess portion 161 in a plan view is sufficiently large with respect to the linear width, the entire linear width direction may be set as the irradiation position of the laser light $L_{41}$.

When adjusting the irradiation direction of the laser light $L_{41}$, there is a tendency that it becomes more difficult to position the irradiation position of the laser light $L_{41}$ in the first region B1 as the size of the recess portion 161 in a plan view decreases. Here, in the embodiment, the adjustment is performed by using the monitor 300, that is, while watching the monitor 300.

Figure 12:
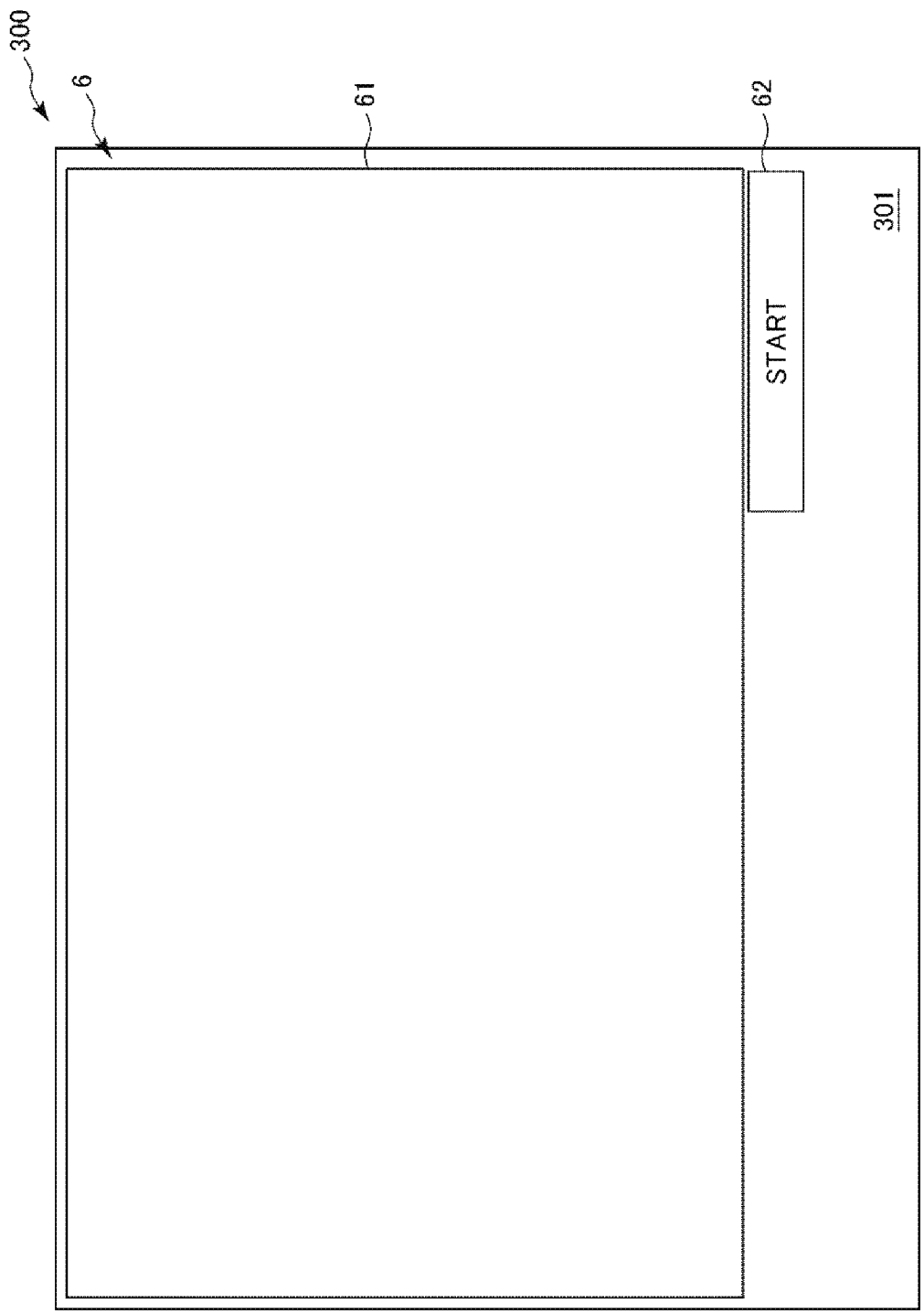
FIG. 12 is one example of an image used when the position of the light to be emitted to the test unit disposed in the test region illustrated in FIG. 3 is being adjusted.

When adjusting the irradiation direction of the laser light $L_{41}$, the screen 6 illustrated in FIG. 12 is displayed on the monitor 300. The screen 6 includes a captured image display unit 61 for displaying the captured image enlarged and captured by the capturing unit 5, and a start button (operation unit) 62 for starting the adjustment of the irradiation direction of the laser light $L_{41}$. In addition, when the start button 62 is operated, the screen 6 is in the state illustrated in FIG. 13.

Figure 13:
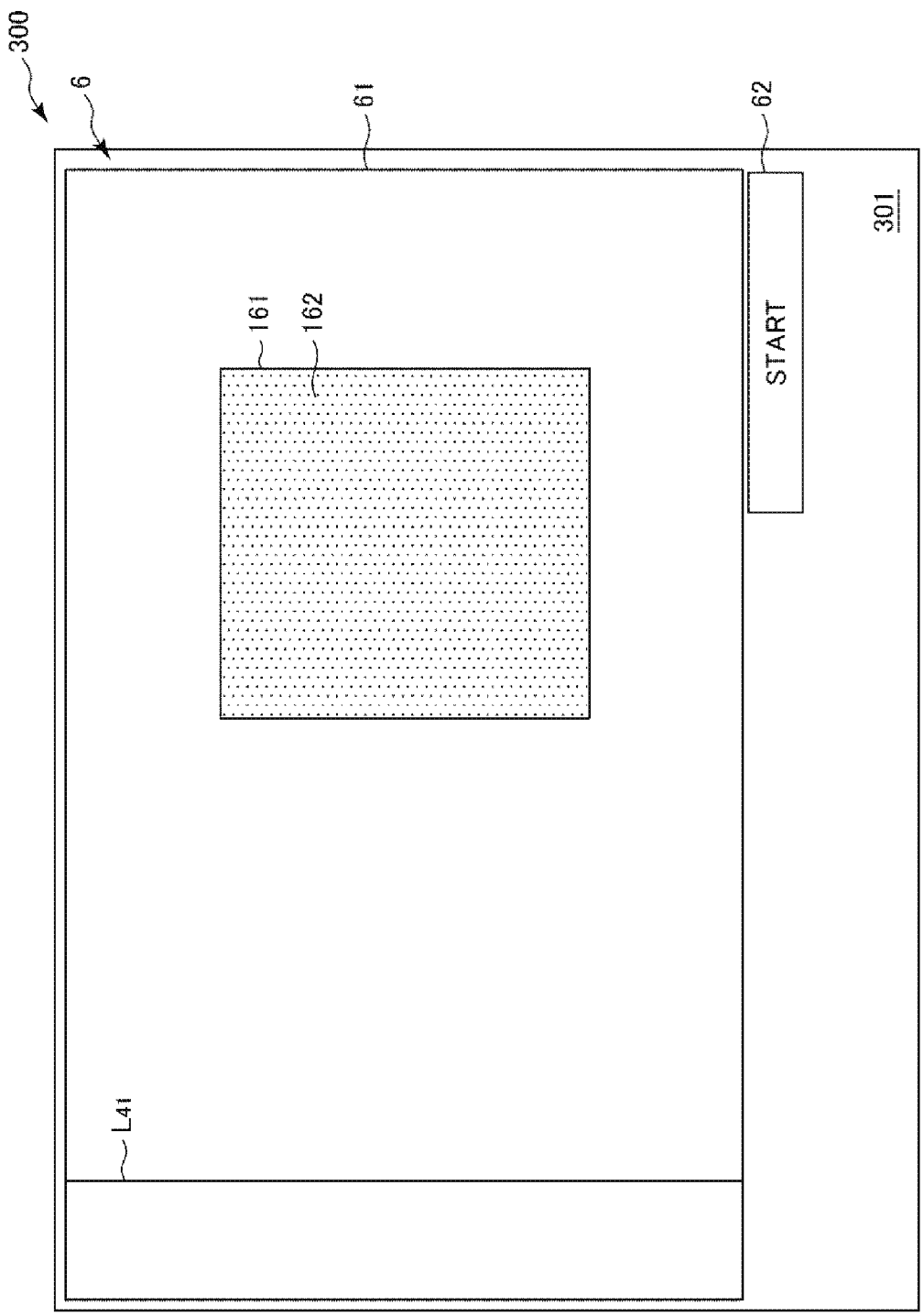
FIG. 13 is one example of an image used when the position of the light to be emitted to the test unit disposed in the test region illustrated in FIG. 3 is being adjusted.

As illustrated in FIG. 13, the image of the recess portion 161 and the image of the projection shape of the laser light $L_{41}$ are displayed on the captured image display unit 61.

In addition, when the start button 62 is operated, as the image of the recess portion 161 is displayed on the captured image display unit 61, the device transport head 17 evacuates to the upper side or the lower side in FIG. 3 within the test region A3. Accordingly, it is possible to acquire the image of the entire test unit 16.

Figure 14:
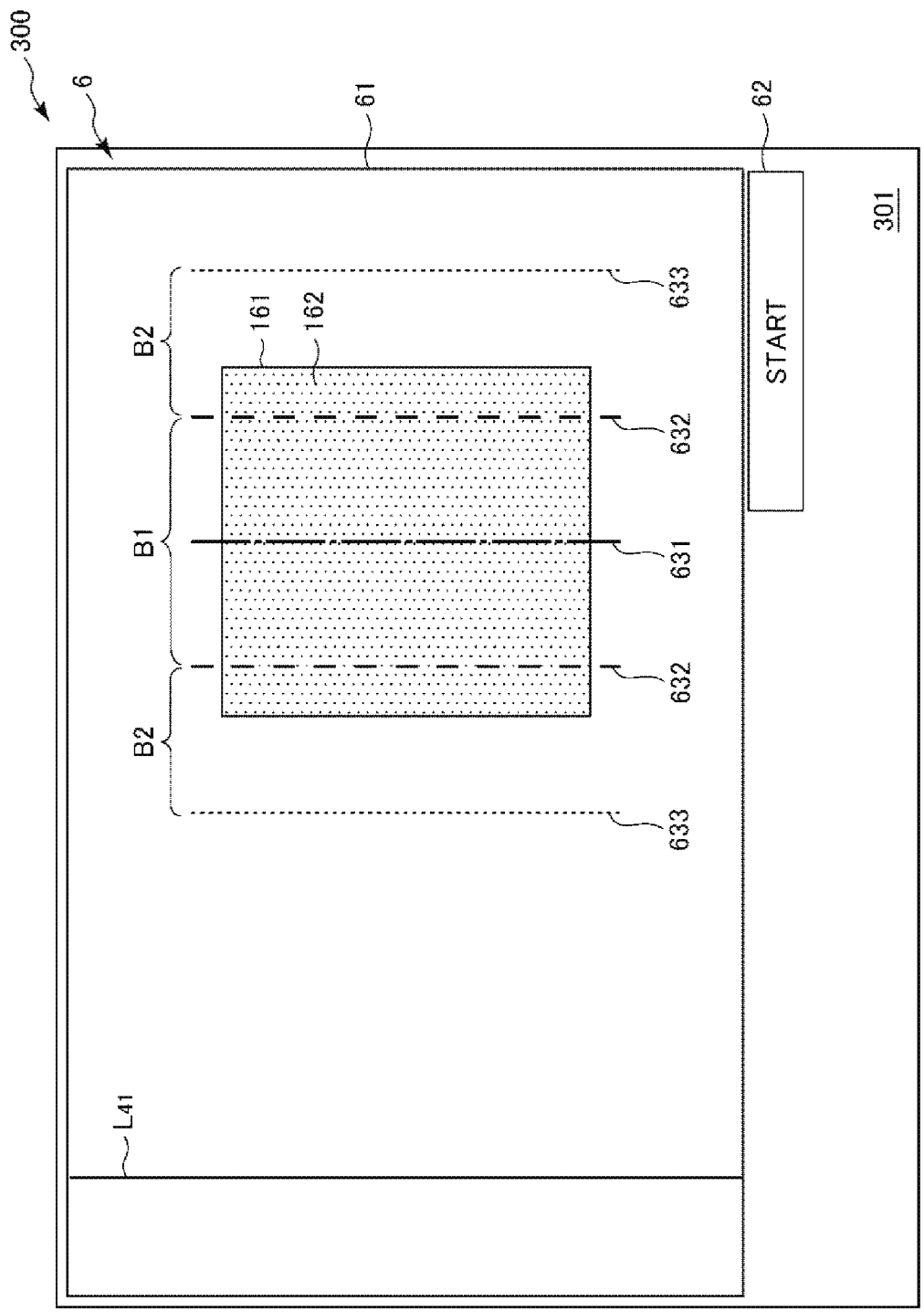
FIG. 14 is one example of an image used when the position of the light to be emitted to the test unit disposed in the test region illustrated in FIG. 3 is being adjusted.

Subsequently, as illustrated in FIG. 14, in the captured image display unit 61, a one-dot chain line 631 indicating the center portion $O_{162}$ of the bottom surface 162 of the recess portion 161, a first broken line 632 indicating the limit in the X direction of the first region B1, and a second broken line 633 indicating the limit in the X direction of the second region B2, are additionally displayed.

In this manner, the monitor 300 (display unit) can display the screen 6 indicating where the irradiation position of the laser light source 41 is located, that is, an image obtained by capturing the projection position of the laser light $L_{41}$ (light) and the test unit 16 (electronic component placement unit). In addition, while confirming the screen 6 in the state illustrated in FIG. 14, it is possible to adjust the rotation angle $\theta_{41}$ of the laser light source 41. Accordingly, it is possible to grasp the irradiation position of the laser light $L_{41}$, and to adjust the irradiation position so as to overlap the first region B1, particularly, the one-dot chain line 631 (the center portion $O_{162}$ of the bottom surface 162 of the recess portion 161) as much as possible.

By using the monitor 300 as described above, regardless of the magnitude of the size of the recess portion 161 in a plan view, the irradiation direction of the laser light $L_{41}$ emitted from each of the laser light sources 41 can be accurately adjusted to the first region B1 which is a target position of the test unit 16.

Second Embodiment

Hereinafter, a second embodiment of the electronic component handler and the electronic component tester according to the invention will be described with reference to FIG. 15, but the description will focus on a point different from the above-described embodiments, and the description of the same contents will be omitted.

The embodiment is similar to the first embodiment except for the configuration of a screen displayed on the monitor.

Figure 15:
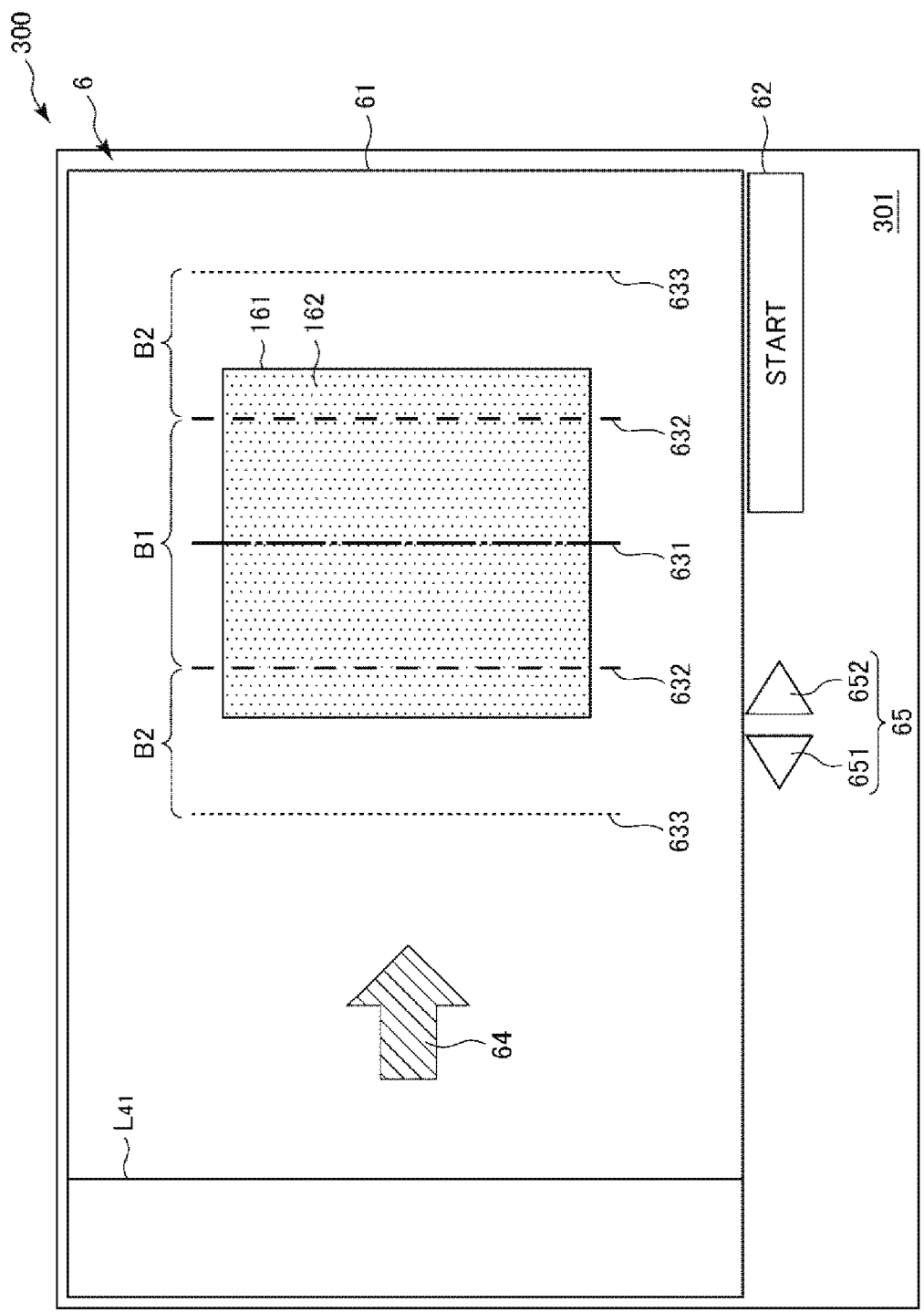
FIG. 15 is one example of an image used when adjusting a position of light to be emitted to a test unit disposed in a test region of an electronic component tester (second embodiment) according to the invention.

As illustrated in FIG. 15, in the embodiment, the screen 6 includes an arrow 64 indicating the direction in which the laser light $L_{41}$ is to be moved, and an operation button 65 for performing an operation for moving the laser light $L_{41}$.

In a case where the irradiation position of the laser light $L_{41}$ is not yet within the first region B1, when confirming the direction indicated by the arrow 64, it is possible to grasp in which direction the irradiation position may be moved. For example, a configuration in which the position of the recess portion 161 (socket) and the current irradiation position of the laser light $L_{41}$ (line laser) is recognized from the image captured by the camera 51, and an arrow on a display screen 301 is described by blinks or the like to indicate a direction in which a difference of pixels decreases, may be employed.

In addition, an operation button 65 is used for moving the irradiation position. The operation button 65 is configured with a left side movement button 651 and a right side movement button 652. When the left side movement button 651 is operated, the irradiation position moves to the left side, and when the right side movement button 652 is operated, the irradiation position moves to the right side. In the configuration illustrated in FIG. 15, since the irradiation position is moved to the right side, the right side movement button 652 is operated. In this case, for example, the right side movement button 652 may blink in order to emphasize the right side movement button 652 so as to urge the operation of the right side movement button 652.

In addition, in the embodiment, a motor (not illustrated) that serves as a driving source for rotating each of the laser light sources 41 around the rotation axis $O_{41}$ is embedded. Each of the motors is interlocked with the operation button 65, and when operating the left side movement button 651, it is possible to rotate each of the laser light sources 41 around the rotation axis $O_{41}$ in a direction in which the rotation angle $\theta_{41}$ decreases. Accordingly, the irradiation position moves to the left side. Further, when operating the right side movement button 652, each of the laser light sources 41 can be rotated around the rotation axis $O_{41}$ in a direction in which the rotation angle $\theta_{41}$ increases. Accordingly, the irradiation position moves to the right side.

Third Embodiment

Hereinafter, a third embodiment of the electronic component handler and the electronic component tester according to the invention will be described with reference to FIG. 16, but the description will focus on a point different from the above-described embodiments, and the description of the same contents will be omitted.

The embodiment is similar to the second embodiment except for the configuration of the screen displayed on the monitor.

Figure 16:
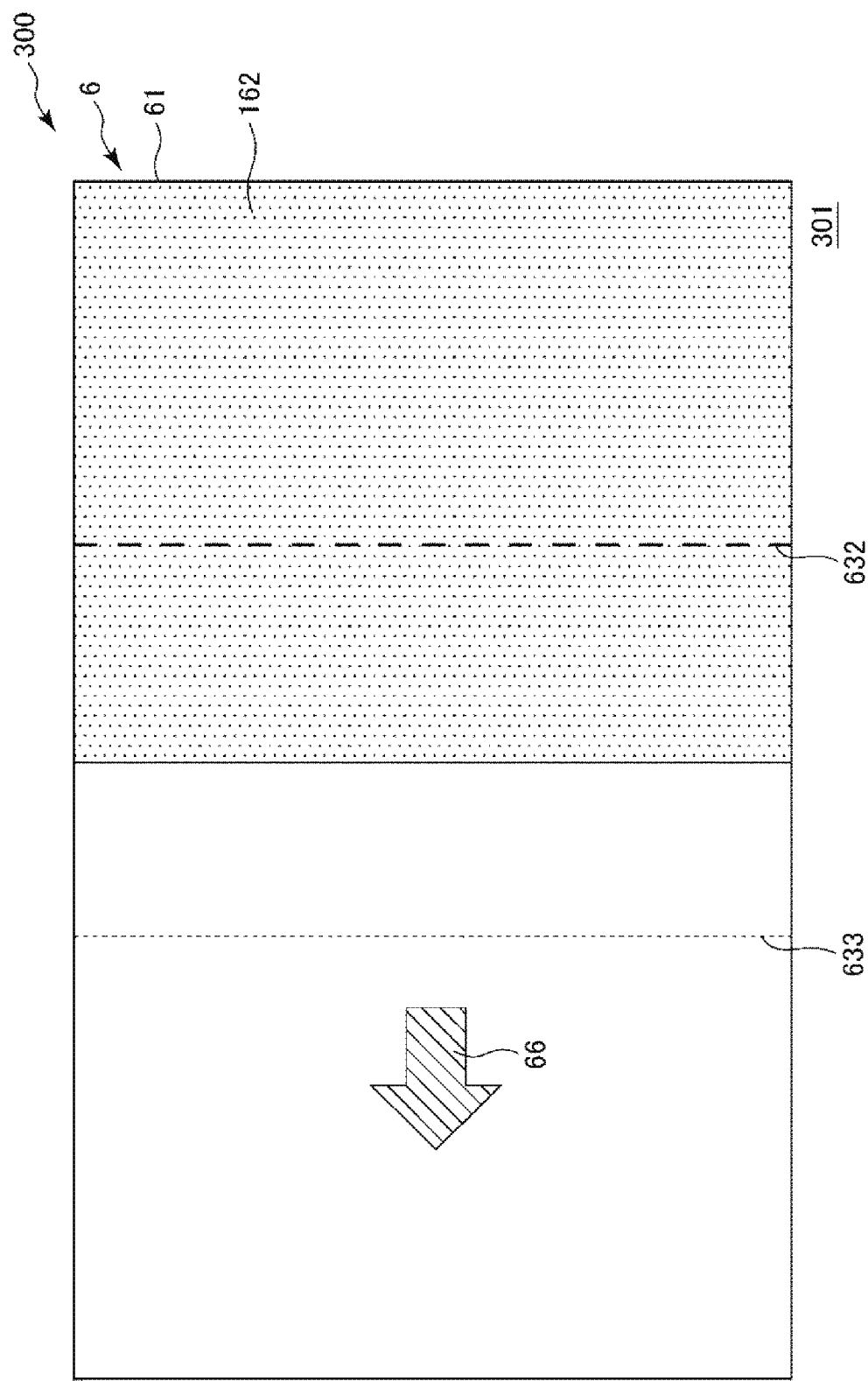
FIG. 16 is one example of an image used when adjusting a position of light to be emitted to a test unit disposed in a test region of an electronic component tester (third embodiment) according to the invention.

As illustrated in FIG. 16, in the embodiment, the captured image display unit 61 of the screen 6 includes an arrow 66 indicating the direction in which the laser light $L_{41}$ exists. Accordingly, even when the bottom surface 162 is enlarged in the captured image display unit 61, and as a result, the laser light $L_{41}$ is not displayed on the captured image display unit 61, when the arrow 66 is confirmed, it is possible to grasp in which direction the laser light $L_{41}$ exists.

In addition, for example, an encoder is embedded in the motor that serves as the driving source of the laser light source 41, and it is possible to detect the direction in which the laser light $L_{41}$ exists based on the encoder value.

Fourth Embodiment

Hereinafter, a fourth embodiment of the electronic component handler and the electronic component tester according to the invention will be described with reference to FIG. 17, but the description will focus on a point different from the above-described embodiments, and the description of the same contents will be omitted.

The embodiment is similar to the third embodiment mainly except for the configuration of the screen displayed on the monitor.

Figure 17:
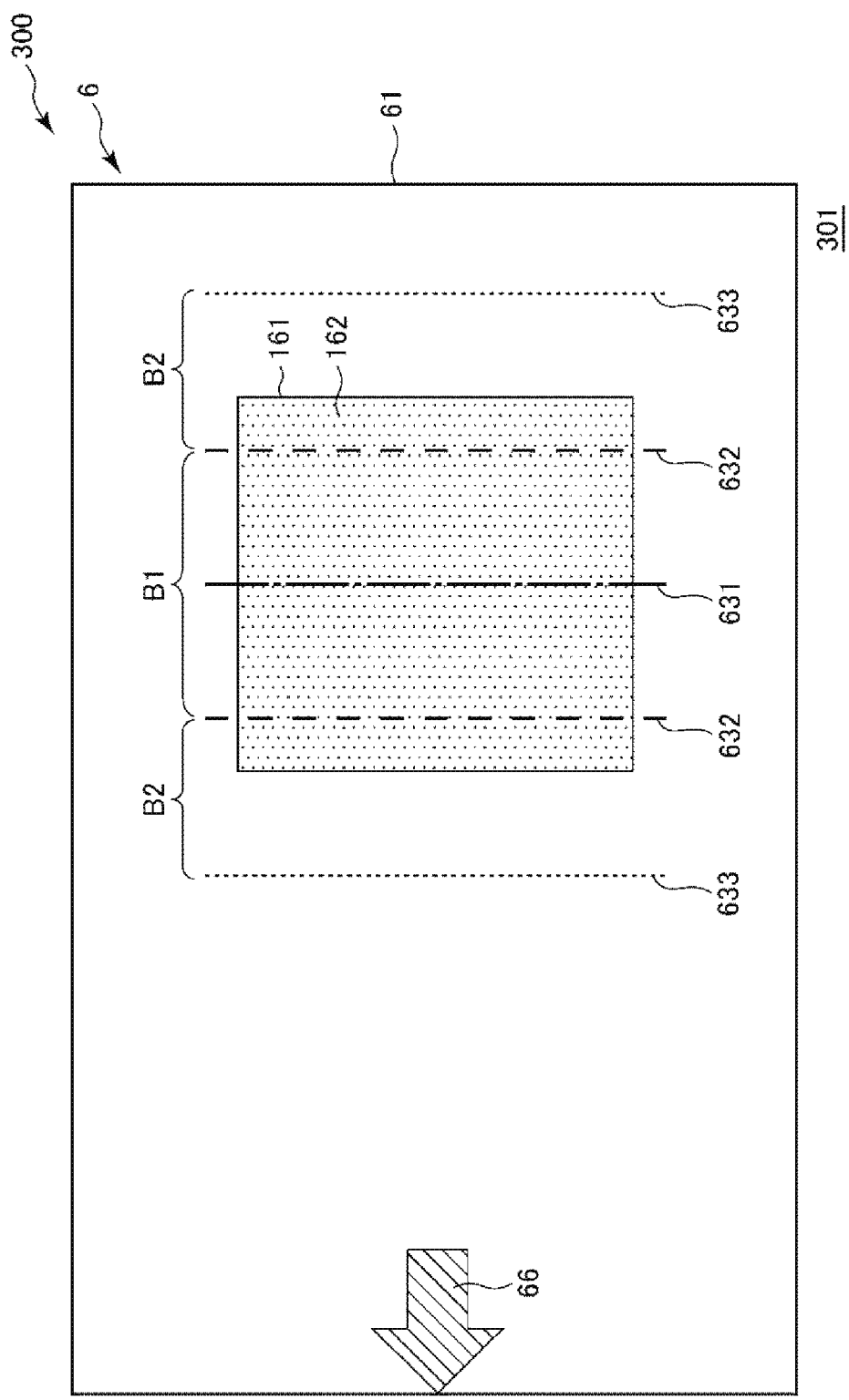
FIG. 17 is one example of an image used when adjusting a position of light to be emitted to a test unit disposed in a test region of an electronic component tester (fourth embodiment) according to the invention.

As illustrated in FIG. 17, in the embodiment, in addition to the arrow 66, the entire recess portion 161, the one-dot chain line 631, the first broken line 632, and the second broken line 633 are displayed on the captured image display unit 61 of the screen 6. In the embodiment, it is possible to switch between the screen 6 having the configuration illustrated in FIG. 17 and the screen 6 having the configuration illustrated in FIG. 16. For example, the embodiment is appropriate in a case where the screen 6 having the configuration illustrated in FIG. 17 is used than a case where the screen 6 having the configuration illustrated in FIG. 16 is used.

Fifth Embodiment

Hereinafter, a fifth embodiment of the electronic component handler and the electronic component tester according to the invention will be described with reference to FIG. 18, but the description will focus on a point different from the above-described embodiments, and the description of the same contents will be omitted.

The embodiment is similar to the second embodiment mainly except for the configuration of the screen displayed on the monitor.

Figure 18:
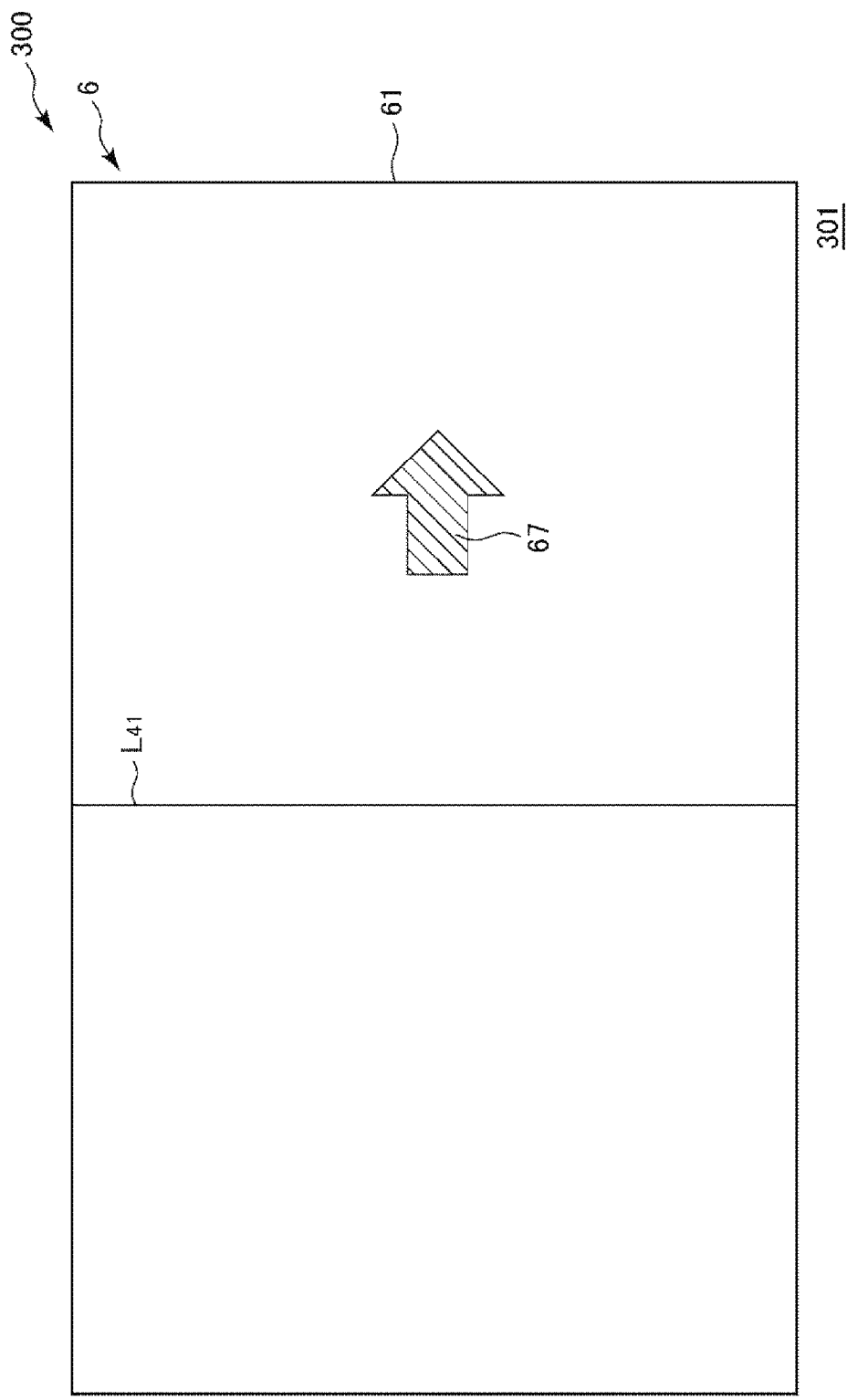
FIG. 18 is one example of an image used when adjusting a position of light to be emitted to a test unit disposed in a test region of an electronic component tester (fifth embodiment) according to the invention.

As illustrated in FIG. 18, in the embodiment, the captured image display unit 61 of the screen 6 includes an arrow 67 indicating a direction in which the recess portion 161, the one-dot chain line 631, the first broken line 632, and the second broken line 633 exist. Accordingly, even when the laser light $L_{41}$ is enlarged in the captured image display unit 61, and as a result, the recess portion 161 and the like are displayed in the captured image display unit 61, when the arrow 67 is confirmed, it is possible to grasp in which direction the laser light $L_{41}$ may be moved.

Sixth Embodiment

Hereinafter, a sixth embodiment of the electronic component handler and the electronic component tester according to the invention will be described with reference to FIGS. 19 to 21, but the description will focus on a point different from the above-described embodiments, and the description of the same contents will be omitted.

The embodiment is the same as the first embodiment except that a configuration in which the notification that the irradiation position of the laser light is at a predetermined position is possible is employed.

In the embodiment, the electronic component handler 10 includes: the transport unit 25 which transports the electronic component; the test region A3 (region) where the test unit 16 which is the electronic component placement unit on which the electronic component is placed is capable of being disposed; the light irradiation unit 4 which is capable of emitting the laser light $L_{41}$ (light) and capable of adjusting the irradiation direction of the laser light $L_{41}$ (light) with respect to the test unit 16 (electronic component placement unit); the control unit 800 that serves as the processing unit which performs the determination processing about the presence or absence of the electronic component in the test unit 16 (electronic component placement unit) based on at least one of the projection shape and the irradiation position on the test unit 16 (electronic component placement unit) of the laser light $L_{41}$ (light) projected to the test unit 16 (electronic component placement unit); and a speaker 500 that serves as a notification unit which notifies that the irradiation position is at the predetermined position.

Accordingly, when adjusting the irradiation direction of the laser light $L_{41}$, the position and the posture of the light irradiation unit 4 are adjusted while listening to the sound generated from the speaker 500 that the irradiation position of the laser light $L_{41}$ is at a predetermined position. Accordingly, it is possible to grasp the test unit 16 regardless of the size and type of the test unit, and to adjust the irradiation position to be positioned at the target position of the test unit 16. As a result, it is possible to accurately adjust the irradiation direction of the laser light $L_{41}$ emitted from the light irradiation unit 4 with respect to the test unit 16.

In addition, as described above, the test unit 16 (electronic component placement unit) has the recess portion 161 having the IC device 90 (electronic component) accommodated and placed thereon.

Figure 19:
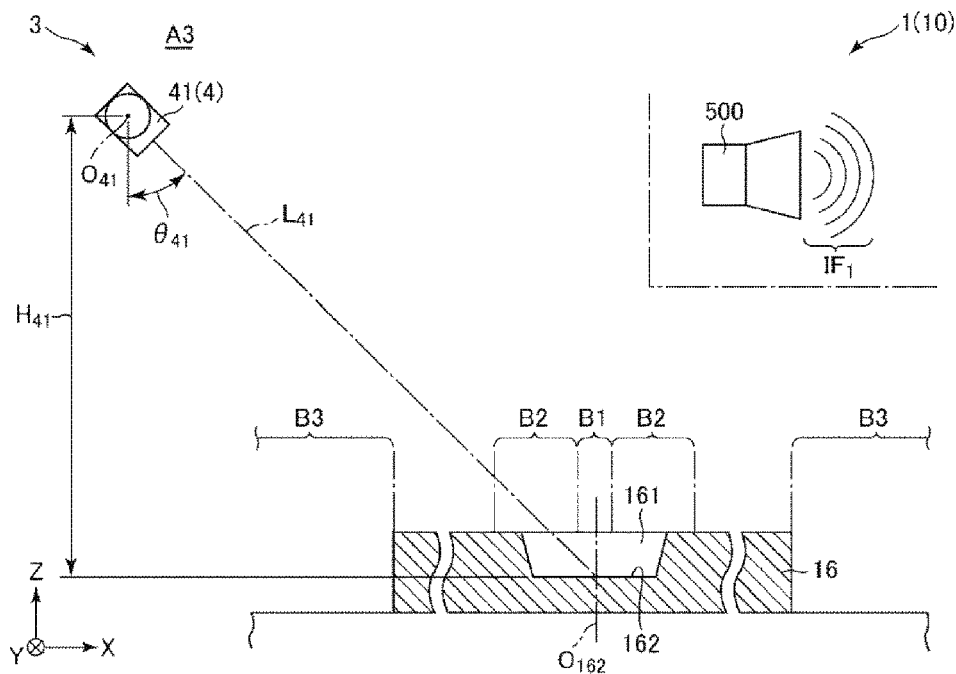
FIG. 19 is a partial sectional view illustrating one example of a state where a position of light to be emitted to a test unit disposed in a test region of an electronic component tester (sixth embodiment) according to the invention is adjusted.

As illustrated in FIG. 19, the speaker 500 (notification unit) makes a first notification $IF_1$ when the irradiation position of the laser light $L_{41}$ is in the first region B1 including the recess portion 161.

Figure 20:
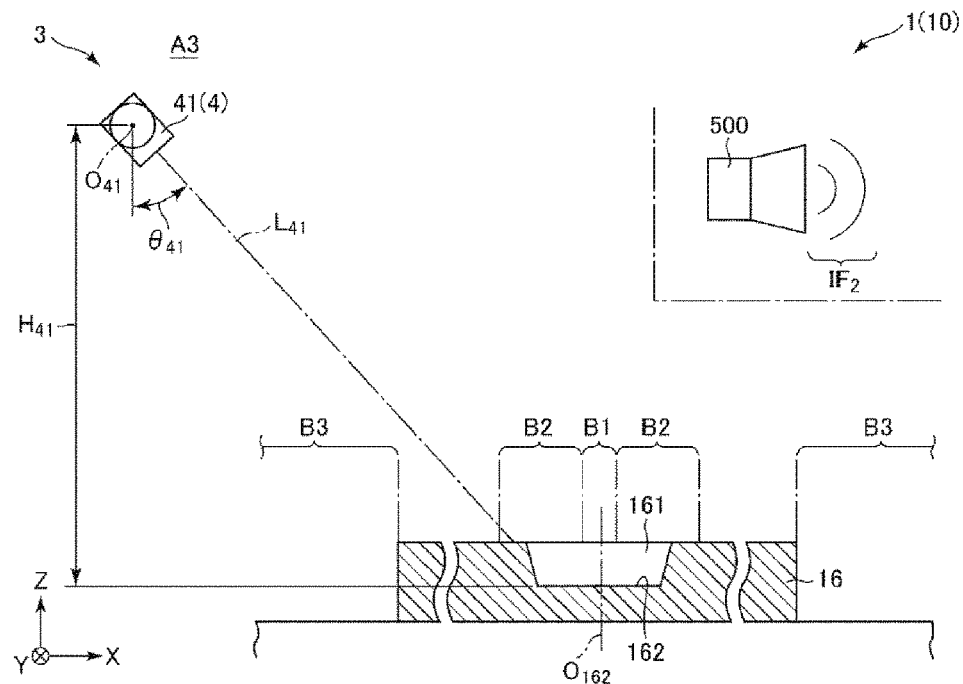
FIG. 20 is a partial sectional view illustrating one example of a state where the position of the light to be emitted to the test unit disposed in the test region of the electronic component tester (sixth embodiment) according to the invention is adjusted.

As illustrated in FIG. 20, the speaker 500 (notification unit) makes a second notification $IF_2$ when the irradiation position of the laser light $L_{41}$ is in the second region B2 on the outside of the first region B1 and on the test unit 16 (electronic component placement unit).

Figure 21:
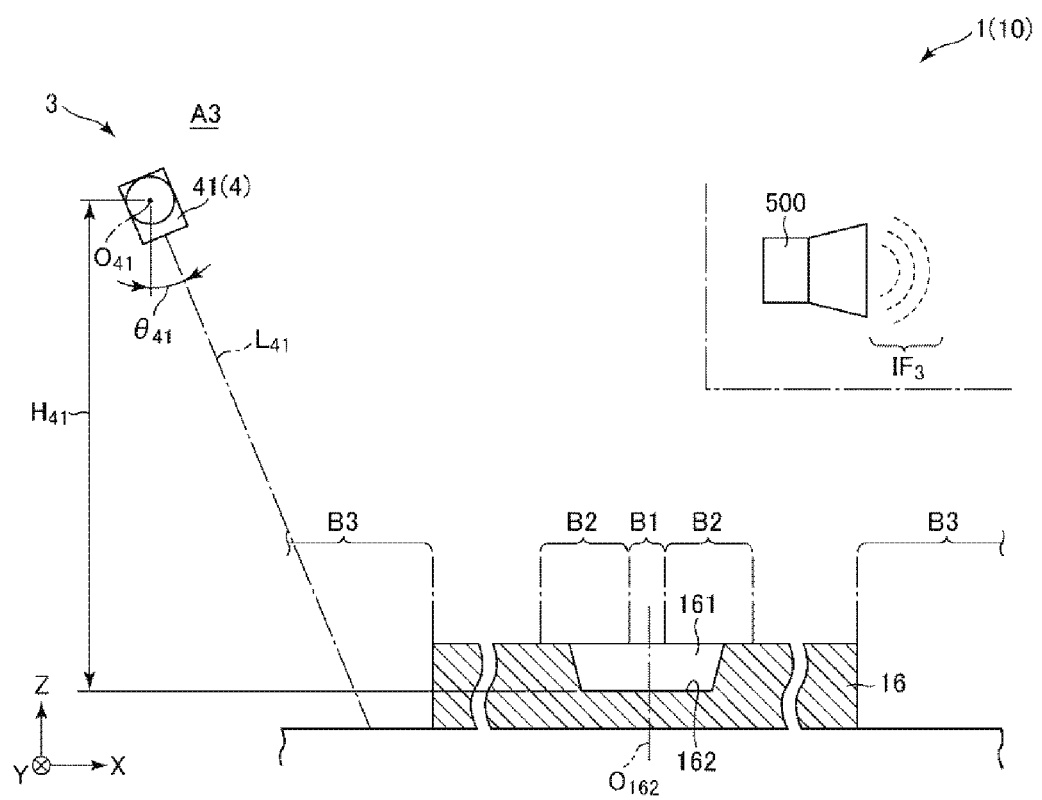
FIG. 21 is a partial sectional view illustrating one example of a state where the position of the light to be emitted to the test unit disposed in the test region of the electronic component tester (sixth embodiment) according to the invention is adjusted.

As illustrated in FIG. 21, the speaker 500 (notification unit) makes a third notification $IF_3$ when the irradiation position of the laser light $L_{41}$ is in the third region B3 on the outside of the test unit 16 (electronic component placement unit).

In addition, by identifying to the first notification $IF_1$, the second notification $IF_2$, and the third notification $IF_3$, it is possible to grasp where the irradiation position of the laser light $L_{41}$ is.

For example, in a case of listening to the first notification $IF_1$, it is possible to determine that the irradiation position of the laser light $L_{41}$ is in the first region B1, and accordingly, it is possible to stop the further adjustment of the turning angle $\theta_{41}$ of the laser light source 41.

Further, for example, in a case of listening to the second notification $IF_2$, it is possible to determine that the irradiation position of the laser light $L_{41}$ is in the second region B2 and is close to the first region B1, and accordingly, the laser light source 41 is adjusted in a direction in which the rotation angle $\theta_{41}$ increases. Accordingly, the irradiation position of the laser light $L_{41}$ is positioned in the first region B1. Further, in this case, the direction in which the irradiation position of the laser light $L_{41}$ is to be moved may be notified by voice or the like.

Further, for example, in a case of listening to the third notification $IF_3$, it is possible to determine that the irradiation position of the laser light $L_{41}$ is in the third region B3 and is distant from the first region B1, and accordingly, the laser light source 41 is adjusted in a direction in which the rotation angle $\theta_{41}$ increases. Accordingly, the irradiation position of the laser light $L_{41}$ is positioned in the first region B1. Further, in this case, the direction in which the irradiation position of the laser light $L_{41}$ is to be moved may also be notified by voice or the like.

The speaker 500 (notification unit) emits sound. In addition, the first notification $IF_1$ and the second notification $IF_2$ are different in sound. In addition, it is preferable that sound of the third notification $IF_3$ is also different from those of the first notification $IF_1$ and the second notification $IF_2$. Accordingly, it is possible to identify the first notification $IF_1$, the second notification $IF_2$, and the third notification $IF_3$ accurately.

Incidentally, as a method of making the sound different, for example, a method of making the intervals of repeatedly emitted sounds (for example, "do" sounds) different, a method of making different pitches, and the like can be employed.

In addition, in the embodiment, the speaker 500 is used as the notification unit which notifies that the irradiation position of the laser light $L_{41}$ is at a predetermined position, but the invention is not limited thereto, and for example, the monitor 300 or a signal lamp 400 can be used. In addition, the speaker 500, the monitor 300, and the signal lamp 400 may be appropriately combined with each other. Further, in the embodiment, the screen 6 displayed on the monitor 300 can be omitted.

Seventh Embodiment

Hereinafter, a seventh embodiment of the electronic component handler and the electronic component tester of the invention will be described with reference to FIG. 22, but the description will focus on a point different from the above-described embodiments, and the description of the same contents will be omitted.

The embodiment is similar to the sixth embodiment except that the detection unit which detects the irradiation position of the laser light is provided.

Figure 22:
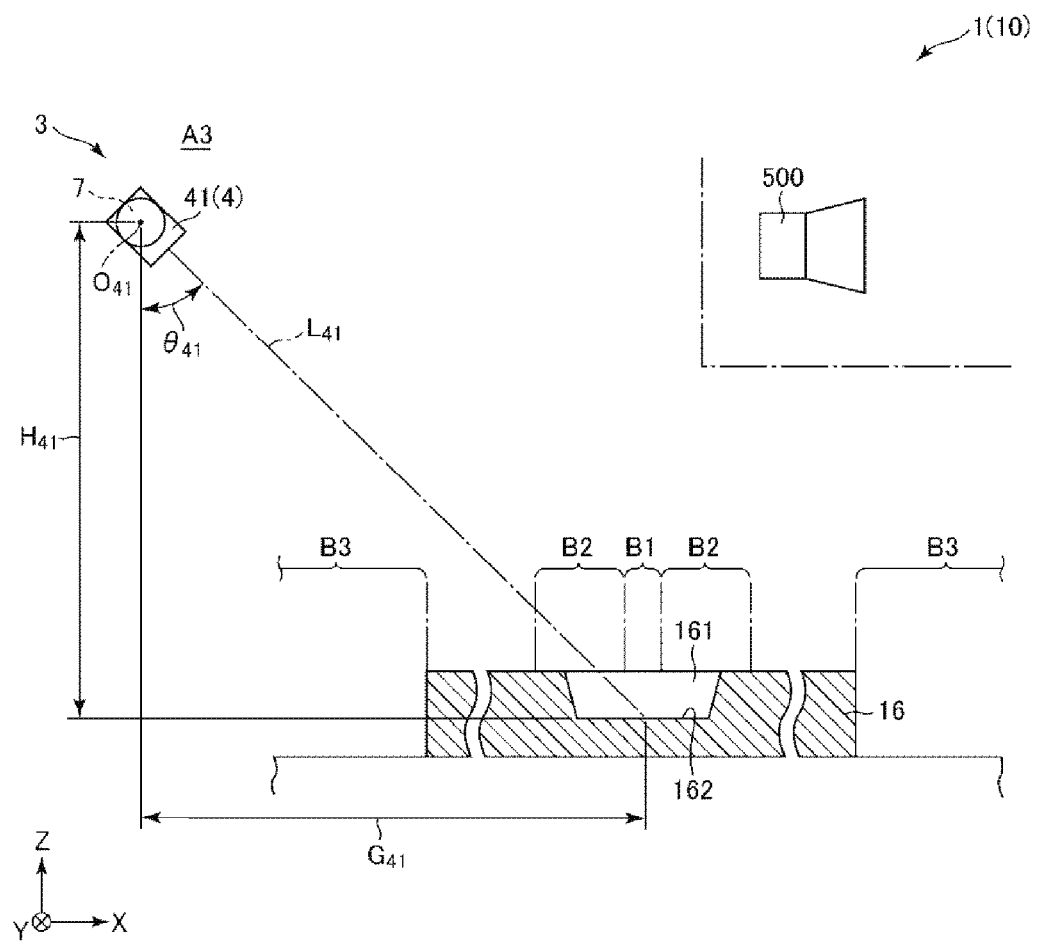
FIG. 22 is a partial sectional view when the inside of a test region of an electronic component tester (seventh embodiment) according to the invention is viewed from a front side.

As illustrated in FIG. 22, in the embodiment, the electronic component handler 10 (electronic component tester 1) includes a detection unit 7 which detects the irradiation position of the laser light $L_{41}$ based on the height $H_{41}$ in the Z direction (perpendicular direction) of the laser light source 41 (light irradiation unit) from the bottom surface 162 of the recess portion 161 and the rotation angle (angle) $O_{41}$ with respect to the Z axis (perpendicular direction) of the laser light source 41 (light irradiation unit). The detection unit 7 includes an encoder embedded in the motor (not illustrated) that serves as the driving source for rotating each of the laser light sources 41 around the rotation axis $O_{41}$. In addition, the rotation angle $\theta_{41}$ is detected based on the encoder value obtained from the encoder. In a case where the height $H_{41}$ is known, by calculating "$(H_{41}) \times (\tan \theta_{41})$" or referring to a calibration curve (table) illustrating the relationship between the heights $H_{41}$ and $\tan \theta_{41}$, a distance $G_{41}$ along the X direction up to the irradiation position of the laser light $L_{41}$ from the rotation axis $O_{41}$ is obtained. Based on the magnitude of the distance $G_{41}$, it is notified by the speaker 500 whether the irradiation position of the laser light $L_{41}$ is in the first region B1, in the second region B2, or in the third region B3.

By the above-described configuration, when adjusting the posture of each of the laser light sources 41, the capturing by the capturing unit 5 can be omitted.

In addition, in the embodiment, the height $H_{41}$ is known, but the invention is not limited thereto, and a configuration in which the height $H_{41}$ is detected may be employed. In this case, for the detection of the height $H_{41}$, for example, a laser length measuring device can be used.

Further, the position at which the rotation angle $\theta_{41}$ is $0\theta$ can be used as a reference position of the encoder.

Eighth Embodiment

Hereinafter, an eighth embodiment of the electronic component handler and the electronic component tester according to the invention will be described with reference to FIG. 23, but the description will focus on a point different from the above-described embodiments, and the description of the same contents will be omitted.

The embodiment is similar to the first embodiment except for the disposition location of the light irradiation unit.

Figure 23:
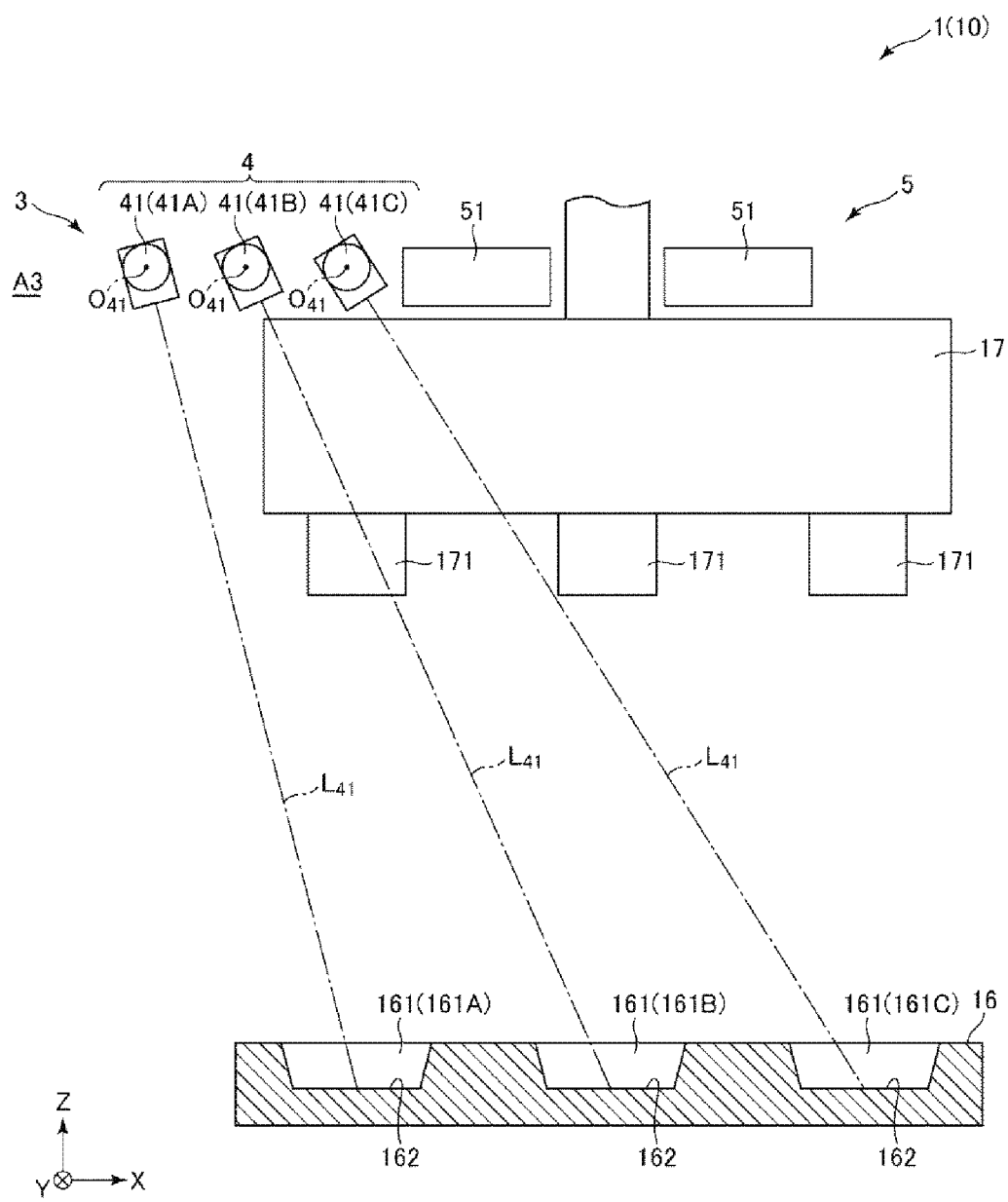
FIG. 23 is a partial sectional view when the inside of a test region of an electronic component tester (eighth embodiment) according to the invention is viewed from a front side.

As illustrated in FIG. 23, in the embodiment, the light irradiation unit 4 is disposed at the upper part with respect to the test unit 16, that is, on the positive side in the Z direction with respect to the test unit 16. As an example, the light irradiation unit 4 is configured with three laser light sources 41. These laser light sources 41 are arranged at intervals along the X direction, and are sometimes referred to as "laser light source 41A", "laser light source 41B", "laser light source 41C" in order from the negative side in the X direction.

The laser light source 41A can emit the laser light $L_{41}$ as slit light along the Y direction toward the recess portion 161A of the test unit 16.

The laser light source 41B can emit the laser light $L_{41}$ as slit light along the Y direction toward the recess portion 161B of the test unit 16.

The laser light source 41C can emit the laser light $L_{41}$ as slit light along the Y direction toward the recess portion 161C of the test unit 16.

The above-described configuration is effective, for example, in a case where it is difficult to dispose the light irradiation unit 4 diagonally upward to the left in FIG. 23 with respect to the test unit 16.

Further, it is preferable that the number of dispositions of the laser light sources 41 is equal to or greater than the number of dispositions of the recess portions 161 along the X direction. In addition, the number of dispositions is three in the embodiment, but the invention is not limited thereto, and for example, the number may be 1, 2, 4 or more.

Ninth Embodiment

Hereinafter, a ninth embodiment of the electronic component handler and the electronic component tester according to the invention will be described with reference to FIG. 24, but the description will focus on a point different from the above-described embodiment, and the description of the same contents will be omitted.

The embodiment is similar to the first embodiment except for the number of dispositions of the device transport head in the test region.

Figure 24:
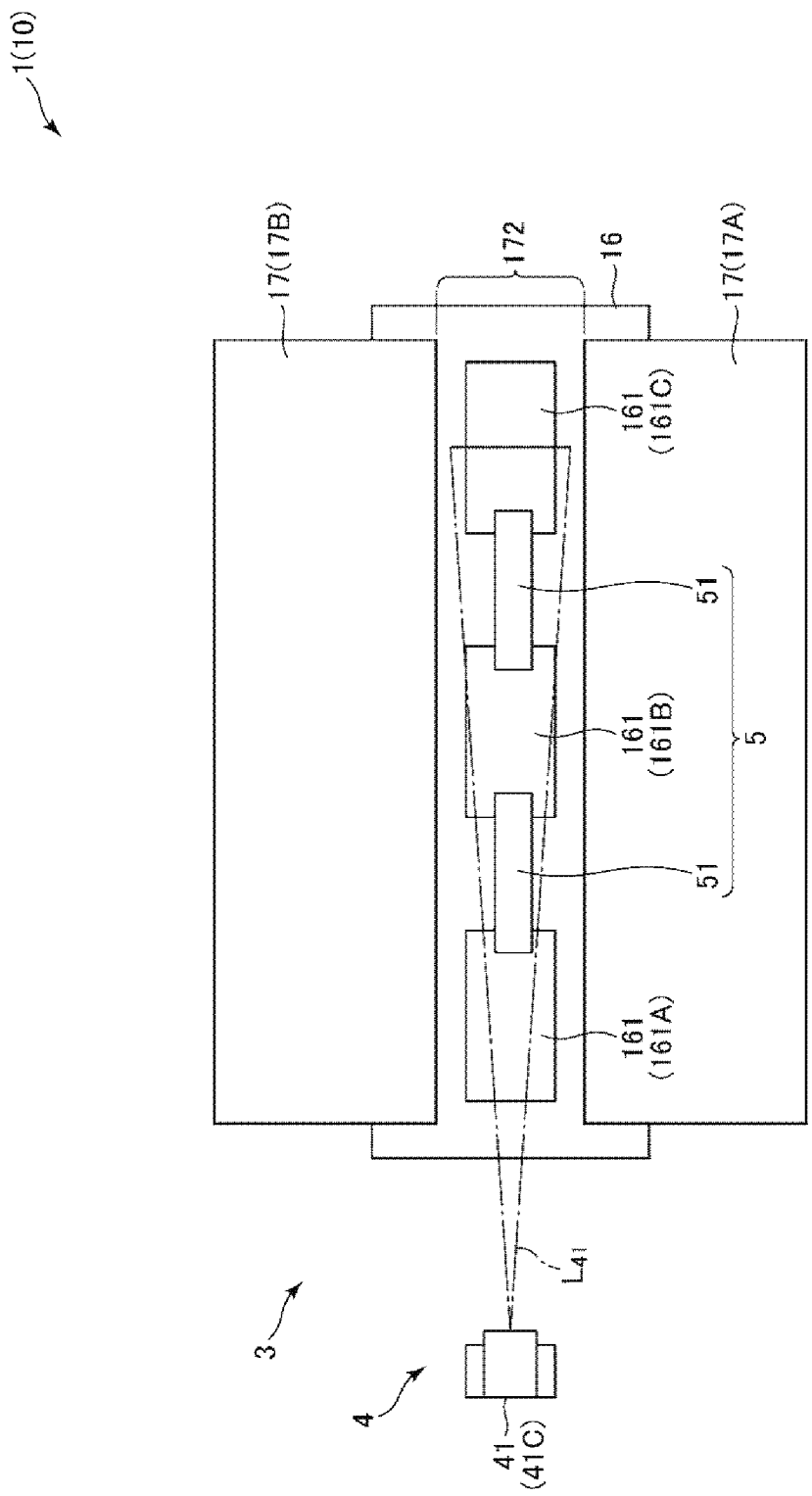
FIG. 24 is an enlarged detailed plan view of the inside of a test region of an electronic component tester (ninth embodiment) according to the invention.

As illustrated in FIG. 24, in the embodiment, two device transport heads 17 are arranged in the Y direction via a gap 172. Hereinafter, the device transport head 17 on the negative side in the Y direction is called "device transport head 17A", and the device transport head 17 on the positive side in the Y direction is called "device transport head 17B". The device transport head 17A can transport the IC device 90 from the device supply unit 14A to the test unit 16 in the test region A3, and the device transport head 17B can transport the IC device 90 from the device supply unit 14B to the test unit 16 in the test region A3. In addition, the device transport head 17A can be responsible for the transport of the IC device 90 from the test unit 16 to the device collect unit 18A in the test region A3, and the device transport head 17B can be responsible for the transport of the IC device 90 from the test unit 16 to the device collect unit 18B in the test region A3.

In addition, in the embodiment, the capturing unit 5 is configured with 2 cameras 51 arranged in the X direction. Each of the cameras 51 can capture an image when the capturing range is different and the gap 172 is positioned immediately below. In addition, by combining the images captured by each of the cameras 51, it is possible to obtain the image of the entire test unit 16.

In addition, the laser light $L_{41}$ emitted from each of the laser light sources 41 passes through the gap 172 and reaches the test unit 16.

In the electronic component tester 1 (electronic component handler 10) configured as described above, the device transport head 17A and the device transport head 17B may be supported so as to be able to approach and separate in the Y direction. In this case, the size of the gap 172 changes. Accordingly, the gap 172 can be widened as much as possible, and thus, the capturing range of each of the cameras 51 can be sufficiently ensured, and the laser light $L_{41}$ sufficiently reaches the test unit 16. As a result, the detection of the remaining state of the IC device 90 in the test unit 16 and the posture adjustment and the position adjustment of each of the laser light source 41 performed prior to the detection can be easily performed.

In addition, the operation in which the device transport head 17A is separated from the device transport head 17B and the gap 172 is enlarged can be performed by operating the start button 62 on the screen 6.

Above, the electronic component handler and the electronic component tester according to the invention are described using the embodiments illustrated in the drawing, but the invention is not limited thereto, and each portion which configures the electronic component handler and the electronic component tester can be replaced with any configuration that can achieve similar functions. In addition, any configuration member may be added.

In addition, the electronic component handler and the electronic component tester according to the invention may combine any of two or more configurations (characteristics) of each of the embodiments.

In addition, although the electronic component placement unit in which the detection of the remaining state is performed is the test unit in each of the embodiments, the invention is not limited thereto, and may be another electronic component placement unit, such as the temperature adjustment unit, the device supply unit, the device collect unit, and the tray for collection.

The entire disclosure of Japanese Patent Application No. 2017-127045, filed Jun. 29, 2017 is expressly incorporated by reference herein.

What is claimed is:

1. An electronic component handler comprising:
a transporter which transports an electronic component;
a test region configured to accommodate an electronic component support having a plurality of recessed pockets in which the electronic component is placed, each of the plurality of recessed pockets having a longitudinal axis aligned with a longitudinal axis of the electronic component support;
a plurality of light sources vertically aligned perpendicular to a face of the test region and differently oriented with respect to the plurality of recessed pockets, each of the plurality of light sources being configured to emit light at one of the plurality of recessed pockets and being configured to adjust an irradiation direction of the light with respect to the one of the plurality of recessed pockets, the plurality of light sources being vertically aligned along a light source axis that intersects and is orthogonal to the longitudinal axes of each of the plurality of recessed pockets;
a processor configured to determine a presence or absence of the electronic component on the electronic component support based on at least one of a projection shape and an irradiation position of the light projected toward the electronic component support; and
a display which displays an image having the projection shape;
wherein the electronic component support comprises an electronic component placement unit.

2. The electronic component handler according to claim 1, wherein the display is configured to display a projection position of the light and an image obtained by capturing the electronic component support.

3. The electronic component handler according to claim 1, further comprising:
a notifier configured to notify that the irradiation position is at a predetermined position.

4. The electronic component handler according to claim 3, wherein the electronic component support has a recess in which the electronic component is accommodated, and
wherein the notifier makes a first notification when the irradiation position is in a first region including the recess and makes a second notification when the irradiation position is in a second region which is outside of the first region and on the electronic component support.

5. The electronic component handler according to claim 4, wherein the notifier emits sound, and
wherein the first notification and the second notification are different sounds.

6. The electronic component handler according to claim 4, wherein the notifier makes a third notification when the irradiation position is in a third region outside of the electronic component support.

7. The electronic component handler according to claim 1, wherein the adjustment of the irradiation direction includes adjusting at least one of a height of the light source in a perpendicular direction relative to the electronic component support and an angle of the light source with respect to the perpendicular direction.

8. The electronic component handler according to claim 1, wherein the projection shape is linear, and
wherein a linear center line in a width direction is the irradiation position.

9. The electronic component handler according to claim 1, wherein the processor is configured to adjust the irradiation direction of the light with respect to the electronic component support prior to determining the presence or absence of the electronic component on the electronic component support.

10. The electronic component handler according to claim 1,
wherein the electronic component support is a tester which is configured to test the electronic component placed thereon.

11. An electronic component handler comprising:

a transporter which transports an electronic component;

a test region configured to accommodate an electronic component support having a plurality of recessed pockets in which the electronic component is placed, each of the plurality of recessed pockets having a longitudinal axis aligned with a longitudinal axis of the electronic component support;

a plurality of light sources vertically aligned perpendicular to a face of the test region and differently oriented with respect to the plurality of recessed pockets, each of the plurality of light sources being configured to emit light at one of the plurality of recessed pockets and being configured to adjust an irradiation direction of the light with respect to the one of the plurality of recessed pockets, the plurality of light sources being vertically aligned along a light source axis that intersects and is orthogonal to the longitudinal axes of each of the plurality of recessed pockets;

a processor configured to determine a presence or absence of the electronic component on the electronic component support based on at least one of a projection shape and an irradiation position on the electronic component support of the light projected to the electronic component support; and a notifier configured to notify that the irradiation position is at a predetermined position;

wherein the electronic component support comprises an electronic component placement unit.

12. The electronic component handler according to claim 11, further comprising:

a detector configured to detect the irradiation position based on a height of a first of the plurality of light sources in a perpendicular direction relative to the electronic component support and an angle of the first of the plurality of light sources with respect to the perpendicular direction.

13. An electronic component tester comprising:

a transporter which transports an electronic component;

an electronic component support having a plurality of recessed pockets in which the electronic component is placed, each of the plurality of recessed pockets having a longitudinal axis aligned with a longitudinal axis of the electronic component support;

a test region configured to accommodate the electronic component support;

a plurality of light sources vertically aligned perpendicular to a face of the test region and differently oriented with respect to the plurality of recessed pockets, each of the plurality of light sources being configured to emit light at one of the plurality of recessed pockets and being configured to adjust an irradiation direction of the light with respect to the one of the plurality of recessed pockets, the plurality of light sources being vertically aligned along a light source axis that intersects and is orthogonal to the longitudinal axes of each of the plurality of recessed pockets;

a processor configured to determine a presence or absence of the electronic component on the electronic component support based on at least one of a projection shape and an irradiation position of the light projected to the electronic component support; and a display which displays an image having the projection shape, wherein the electronic component support is a tester configured to test the electronic component placed thereon.

* * * * *